(12) United States Patent
Matsuzaki

(10) Patent No.: US 9,142,624 B2
(45) Date of Patent: Sep. 22, 2015

(54) SEMICONDUCTOR DEVICE

(75) Inventor: Yoshifumi Matsuzaki, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 14/384,680

(22) PCT Filed: Jul. 3, 2012

(86) PCT No.: PCT/JP2012/067018
§ 371 (c)(1),
(2), (4) Date: Sep. 11, 2014

(87) PCT Pub. No.: WO2014/006695
PCT Pub. Date: Jan. 9, 2014

(65) Prior Publication Data
US 2015/0001667 A1    Jan. 1, 2015

(51) Int. Cl.
*H01L 29/47* (2006.01)
*H01L 29/36* (2006.01)
*H01L 29/872* (2006.01)
*H01L 29/66* (2006.01)
*H01L 29/167* (2006.01)
*H01L 29/32* (2006.01)

(52) U.S. Cl.
CPC ............. *H01L 29/36* (2013.01); *H01L 29/167* (2013.01); *H01L 29/32* (2013.01); *H01L 29/66143* (2013.01); *H01L 29/872* (2013.01)

(58) Field of Classification Search
CPC .................. H01L 29/872; H01L 29/66143
USPC ......................................................... 257/471
See application file for complete search history.

(56) References Cited

FOREIGN PATENT DOCUMENTS

| JP | 2001203372 A | | 7/2001 |
|---|---|---|---|
| JP | 2006-196775 | * | 7/2006 |
| JP | 2006196775 A | | 7/2006 |

OTHER PUBLICATIONS

International Search Report mailed Oct. 9, 2012, corresponds to PCT/JP2012/067018.
International Preliminary Report on Patentability dated Sep. 24, 2013, corresponds to PCT/JP2012/067018.

* cited by examiner

*Primary Examiner* — Yasser A Abdelaziez
*Assistant Examiner* — Hajar Kolahdouzan
(74) *Attorney, Agent, or Firm* — Lowe Hauptman & Ham, LLP

(57) ABSTRACT

A semiconductor device includes a semiconductor base body having an $n^+$-type semiconductor layer and an $n^-$-type semiconductor layer $p^+$-type diffusion regions selectively formed on a surface of the $n^-$-type semiconductor layer, and a barrier metal layer formed on a surface of the $n^-$-type semiconductor layer and surfaces of $p^+$-type diffusion regions. A Schottky junction is between the barrier metal layer and the $n^-$-type semiconductor layer. An ohmic junction is between the barrier metal layer and the $p^+$-type diffusion regions. Platinum is diffused into the semiconductor base body such that a concentration of platinum becomes maximum in a surface of the $n^-$-type semiconductor layer.

6 Claims, 17 Drawing Sheets

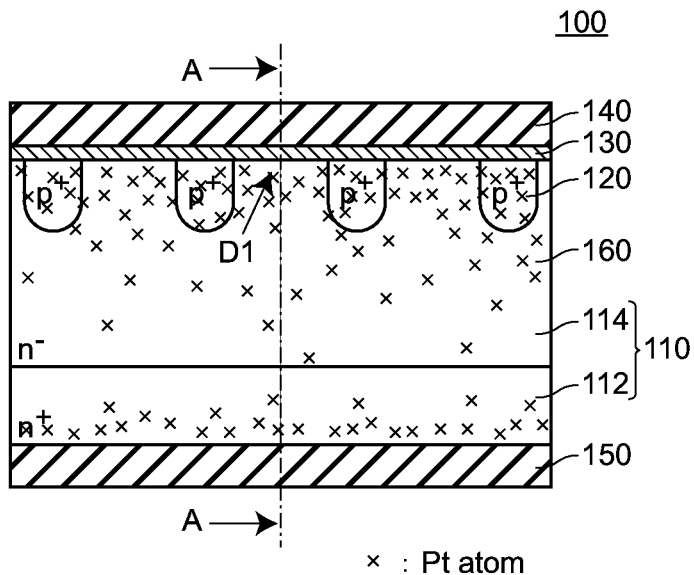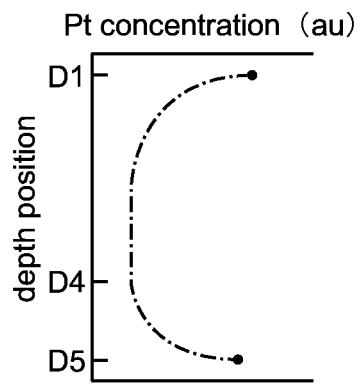
FIG.1A          FIG.1B
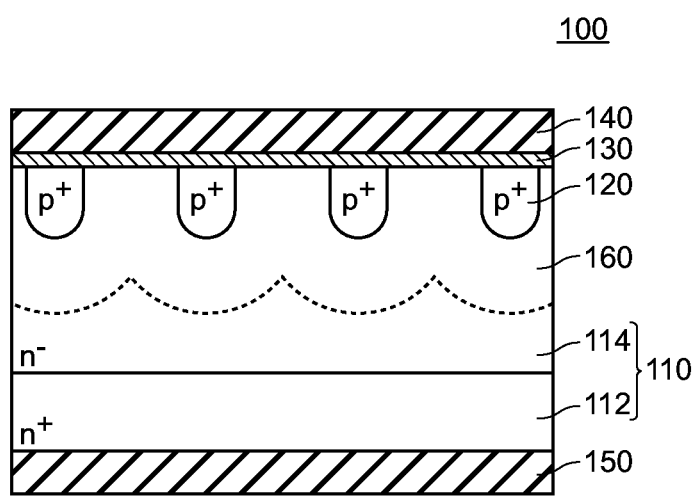
FIG.1C (a)

(b)

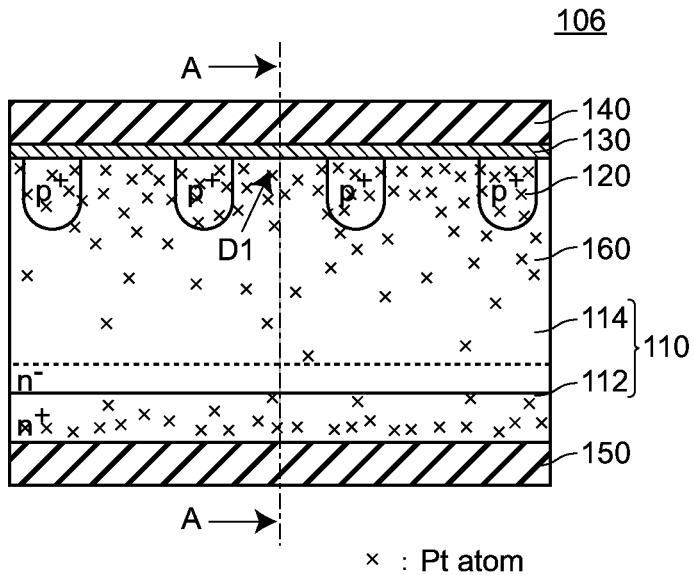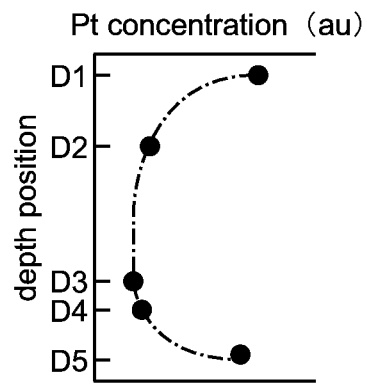
FIG.13A  FIG.13B
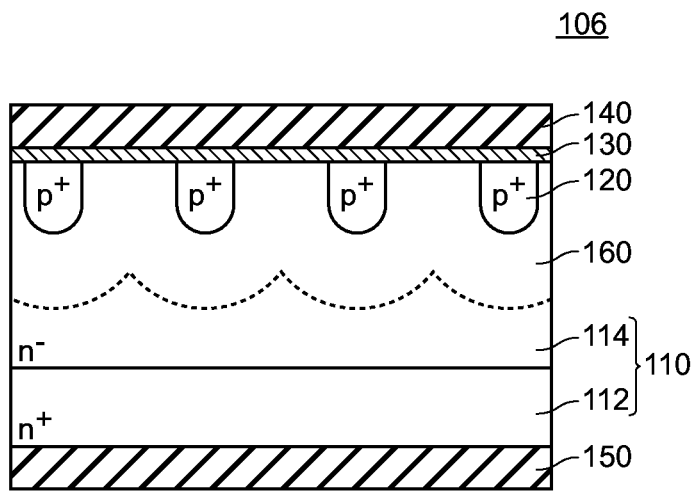
FIG.13C

SEMICONDUCTOR DEVICE

RELATED APPLICATIONS

The present application is a National Phase of International Application Number PCT/JP2012/067018, filed Jul. 3, 2012.

TECHNICAL FIELD

The present invention relates to a semiconductor device.

BACKGROUND ART

Conventionally, there has been known a semiconductor device which is referred to as the JBS structure (for example, see Patent literature 1). FIG. 18A and FIG. 18B are views for explaining a conventional semiconductor device 900. FIG. 18A is a cross-sectional view schematically showing the conventional semiconductor device 900, and FIG. 18B is a view showing a state where a depletion layer 960 extends when a reverse bias is applied to the conventional semiconductor device 900. Since FIG. 18A and FIG. 18B are cross-sectional views which schematically show the conventional semiconductor device 900, the respective elements are drawn with suitable modification in these drawings. Accordingly, sizes of the respective elements, distances between the respective elements and the like are not always accurately expressed. The same goes for drawings which are used hereinafter.

As shown in FIG. 18A, the conventional semiconductor device 900 includes: a semiconductor base body 910 having the structure where the semiconductor base body 910 includes an $n^+$ type semiconductor layer 912 and an $n^-$ type semiconductor layer 914, and the $n^+$ type semiconductor layer 912 and the $n^-$ type semiconductor layer 914 are laminated to each other in this order; $p^+$ type diffusion regions 920 which are selectively formed on a surface of the $n^-$ type semiconductor layer 914; and a barrier metal layer 930 which is formed on the $n^-$ type semiconductor layer 914 and $p^+$ type diffusion regions 920, forms a Schottky junction between the barrier metal layer 930 and the $n^-$ type semiconductor layer 914, and forms an ohmic junction between the barrier metal layer 930 and the $p^+$ type diffusion regions 920. In FIG. 18A and FIG. 18B, symbol 940 indicates an anode electrode layer, and symbol 950 indicates a cathode electrode layer.

The conventional semiconductor device 900 has the structure where the barrier metal layer 930 is formed on the surface of the $n^-$ type semiconductor layer 914 and the surfaces of the $p^+$ type diffusion regions 920 (that is, the JBS structure). Accordingly, as shown in FIG. 18B, when a reverse bias is applied to the conventional semiconductor device 900, the whole region of the surface of the $n^-$ type semiconductor layer 914 is pinched off due to the depletion layer 960 extending toward an $n^-$ type semiconductor layer 914 side from boundary surfaces between the $n^-$ type semiconductor layer 914 and the $p^+$ type diffusion regions 920 and hence, a reverse withstand voltage VR can be increased, and a leak current IR can be lowered.

PRIOR ART LITERATURE

Patent Literature

Patent Literature 1: JP-A-2001-203372

SUMMARY OF THE INVENTION

Technical Problem

However, the conventional semiconductor device 900 has the following drawbacks. FIG. 19 and FIG. 20 are views for explaining the drawbacks that the conventional semiconductor device 900 has. In the conventional semiconductor device 900, in an attempt to lower a forward drop voltage VF or to shorten a reverse recovery time trr, it is necessary to decrease a rate of an area where the $p^+$ type diffusion region 920 is formed (see FIG. 19, in this case, the rate of the area of the $p^+$ type diffusion region 920 being decreased by increasing a gap between the $p^+$ type diffusion regions 920), to increase a concentration of an impurity of an n-type in the $n^-$ type semiconductor layer 914 (see FIG. 20) or to decrease a thickness of the $n^-$ type semiconductor layer 914.

However, in the conventional semiconductor device 900, when the rate of the formed area of $p^+$ type diffusion regions 920 is decreased or the concentration of the impurity of an n-type in the $n^-$ type semiconductor layer 914 is increased, as shown in FIG. 19 and FIG. 20, the whole region of the surface of the $n^-$ type semiconductor layer 914 is hardly pinched off at the time of applying a reverse bias to the conventional semiconductor device 900. Accordingly, there exists a drawback that in an actual operation, it is not easy to lower a forward drop voltage VF or to shorten a reverse recovery time trr while maintaining a high reverse withstand voltage VR and a low leak current IR. Further, the conventional semiconductor device 900 has a drawback that a reverse withstand voltage VR is lowered when a thickness of the $n^-$ type semiconductor layer 914 is decreased.

The present invention has been made to overcome the above-mentioned drawbacks, and it is an object of the present invention to provide a semiconductor device which can lower a forward drop voltage VF or can shorten a reverse recovery time trr while maintaining a high reverse withstand voltage VR and a low leak current IR.

[1] A semiconductor device according to the present invention includes: a semiconductor base body having the structure where a first semiconductor layer of a first conductive type and a second semiconductor layer of a first conductive type containing an impurity of a first conductive type at a concentration lower than a concentration of the impurity of the first conductive type contained in the first semiconductor layer are laminated to each other in this order; a high concentration diffusion region of a second conductive type selectively formed on a surface of the second semiconductor layer, and containing an impurity of a second conductive type opposite to the conductive type of the impurity of the first conductive type at a concentration higher than a concentration of the impurity of the first conductive type which the second semiconductor layer contains; and a barrier metal layer formed on a surface of the second semiconductor layer and a surface of the high concentration diffusion region, forming a Schottky junction between the barrier metal layer and the second semiconductor layer, and forming an ohmic junction between the barrier metal layer and the high concentration diffusion region, wherein heavy metal is diffused into the semiconductor base body such that a concentration of heavy metal becomes maximum in a surface of the second semiconductor layer.

[2] In the semiconductor device of the present invention, assuming a depth position in the surface of the second semiconductor layer as D1, a depth position in a deepest portion of the high concentration diffusion region as D2, a depth position which is deeper than the depth position D2 and is shallower than a boundary surface between the first semiconductor layer and the second semiconductor layer as D3, a depth position of the boundary surface between the first semiconductor layer and the second semiconductor layer is D4, and a depth position in the surface of the first semiconductor layer as D5, it is preferable that the concentration of the heavy metal at the depth position D4 is higher than the concentration of the heavy metal at the depth position D3.

[3] In the semiconductor device of the present invention, it is preferable that the depth position D3 is a depth position at which a tail current is controllable at the time of switching off the semiconductor device.

[4] In the semiconductor device of the present invention, it is preferable that the concentration of the heavy metal at the depth position D2 is higher than the concentration of the heavy metal at the depth position D3.

[5] In the semiconductor device of the present invention, it is preferable that the concentration of the heavy metal at the depth position D1 is higher than the concentration of the heavy metal at the depth position D5.

[6] In the semiconductor device of the present invention, it is preferable that the heavy metal is diffused from a side of a surface of the first semiconductor layer.

[7] In the semiconductor device of the present invention, it is preferable that the concentration of the heavy metal in a surface of the second semiconductor layer is higher than the concentration of the heavy metal in a surface of the high concentration diffusion region.

[8] In the semiconductor device of the present invention, it is preferable that the concentration of the heavy metal in a surface of the high concentration diffusion region is higher than the concentration of the heavy metal in a surface of the second semiconductor layer.

[9] In the semiconductor device of the present invention, it is preferable that the heavy metal is platinum.

Advantageous Effects of Invention

According to the semiconductor device of the present invention, the semiconductor device has the structure where the barrier metal layer is formed on the surface of the second semiconductor layer and the surface of the high concentration diffusion region (that is, the JBS structure). Accordingly, at the time of applying a reverse bias, the whole region of a surface of the second semiconductor layer is pinched off due to a depletion layer extending toward a second semiconductor layer side from a boundary surface between the second semiconductor layer and the high concentration diffusion region and hence, a reverse withstand voltage VR can be increased and, at the same time, a leak current IR can be lowered.

According to the semiconductor device of the present invention, heavy metal is diffused in the semiconductor base body such that the concentration of heavy metal becomes maximum in a surface of the second semiconductor layer and hence, a depletion layer simulatively extends in the vicinity of the surface of the second semiconductor layer in the same manner as the case where the concentration of an impurity of a first conductive type is lowered. Accordingly, in the semiconductor device of the present invention, the whole region of the surface of the second semiconductor layer can be easily pinched off at the time of applying a reverse bias (see FIG. 1C described later) and hence, it is possible to lower a forward drop voltage VF or to shorten a reverse recovery time trr compared to the conventional semiconductor device 900 while maintaining a high reverse withstand voltage VR and a low leak current IR.

As a result, the present invention can provide the semiconductor device which can lower a forward drop voltage VF or can shorten a reverse recovery time trr while maintaining a high reverse withstand voltage VR and a low leak current IR.

According to the semiconductor device of the present invention, the reverse withstand voltage VR can be increased and hence, a thickness of the second semiconductor layer can be decreased. Also from this point or view, it is possible to lower a forward drop voltage VF or to shorten a reverse recovery time trr.

According to the semiconductor device of the present invention, heavy metal is diffused such that the concentration of heavy metal becomes maximum in the surface of the second semiconductor layer. Accordingly, although a carrier extinction speed is increased in the surface of the second semiconductor layer, a carrier extinction speed is not increased so much in a bottom portion of the second semiconductor layer (in the vicinity of a boundary surface between the second semiconductor layer and the first semiconductor layer) and hence, noises generated at the time of switching off the semiconductor device can be decreased (see FIG. 15 described later) thus providing the semiconductor device having an excellent soft recovery characteristic.

BRIEF EXPLANATION OF DRAWINGS

FIG. 1A to FIG. 1C are views for explaining a semiconductor device 100 according to an embodiment 1.

FIG. 13A to FIG. 13C are views for explaining a semiconductor device 106 according to an embodiment 4.

DESCRIPTION OF EMBODIMENTS

Figure 2A:
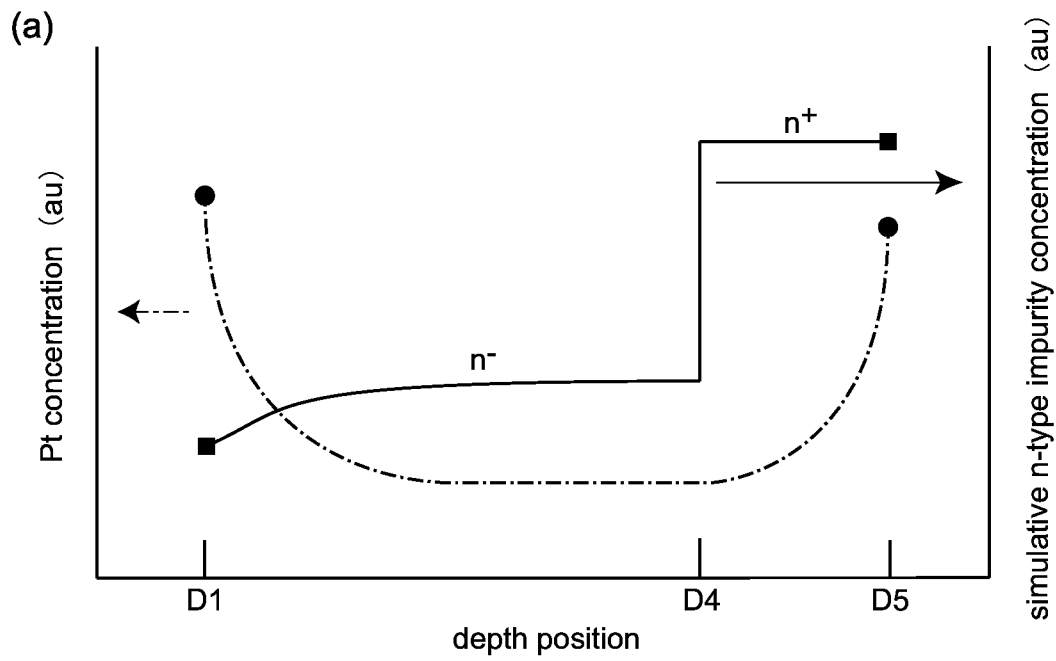
FIG. 2A and FIG. 2B are graphs for explaining a state where impurity of an n-type concentration is simulatively lowered when heavy metal (platinum) is diffused.

Hereinafter, semiconductor devices and methods of manufacturing a semiconductor device of the present invention are explained in conjunction with embodiments shown in the drawings.

Embodiment 1

A. Semiconductor Device 100 According to Embodiment 1

FIG. 1A to FIG. 1C are views for explaining a semiconductor device 100 according to the embodiment 1. FIG. 1A is a cross-sectional view of the semiconductor device 100, FIG. 1B is a graph showing the concentration distribution of heavy metal (platinum) in a semiconductor base body 110, and FIG. 1C is a view showing a state where a depletion layer 160 extends when a reverse bias is applied to the semiconductor device 100.

As shown in FIG. 1, the semiconductor device 100 according to the embodiment 1 includes: a semiconductor base body 110 having the structure where an $n^+$-type semiconductor layer (a first semiconductor layer of a first conductive type) 112 and an $n^-$-type semiconductor layer (a second semiconductor layer of a first conductive type) 114 containing an impurity of an n-type (an impurity of a first conductive type) at a concentration lower than a concentration of the impurity of the first conductive type contained in the $n^+$-type semiconductor layer 112 are laminated to each other in this order; $p^+$-type diffusion regions (high concentration diffusion regions of a second conductive type) 120 selectively formed on a surface of the $n^-$-type semiconductor layer 114, and containing an impurity of a $p^+$-type (an impurity of a second conductive type) at a concentration higher than a concentration of the impurity of an n-type which the $n^-$-type semiconductor layer 114 contains; and a barrier metal layer 130 formed on a surface of the $n^-$-type semiconductor layer 114 and surfaces of $p^+$-type diffusion regions 120, forming a Schottky junction between the barrier metal layer 130 and the $n^-$-type semiconductor layer 114, and forming an ohmic junction between the barrier metal layer 130 and the $p^+$-type diffusion regions 120.

In the semiconductor device 100 according to the embodiment 1, heavy metal is diffused in the semiconductor base body 110 such that the concentration of heavy metal becomes maximum in the surface of the $n^-$-type semiconductor layer 114. In this specification, "heavy metal is diffused such that the concentration of heavy metal becomes maximum in the surface of the $n^-$-type semiconductor layer" means that "heavy metal is diffused such that the concentration of heavy metal becomes maximum in the surface of the $n^-$-type semiconductor layer 114 with respect to the $n^-$-type semiconductor layer 114". In the semiconductor device 100 according to the embodiment 1, the concentration of heavy metal in the surface of the $n^-$-type semiconductor layer is higher than the concentration of heavy metal in the surface of the $n^+$-type semiconductor layer.

In other words, assuming a depth position in the surface of the $n^-$-type semiconductor layer 114 as D1, a depth position at a boundary surface between the $n^+$-type semiconductor layer 112 and the $n^-$-type semiconductor layer 114 as D4, and a depth position in the surface of the $n^+$-type semiconductor layer 112 as D5, the concentration of heavy metal at the depth position D1 is higher than the concentration of heavy metal at the depth position D4. In the semiconductor device 100 according to the embodiment 1, the concentration of heavy metal at the depth position D1 is higher than the concentration of heavy metal at the depth position D5.

The above-mentioned "depth position" means a "depth position" from the surface of the $n^-$-type semiconductor layer 114. In FIG. 1, symbol 140 indicates an anode electrode layer, and symbol 150 indicates a cathode electrode layer. Out of main surfaces of the semiconductor base body 110, the main surface on which the anode electrode layer 140 is formed forms a first main surface, and the main surface on which the cathode electrode layer 150 is formed forms a second main surface.

A thickness of the semiconductor base body 110 is 400 μm, for example. A thickness of the $n^+$-type semiconductor layer 112 is 350 μm, for example, and the impurity concentration in the $n^+$-type semiconductor layer 112 is $1\times10^{19}$ cm$^{-3}$, for example. A thickness of the $n^-$-type semiconductor layer 114 is 50 μm, for example, and the impurity concentration in the $n^-$-type semiconductor layer 114 is $1\times10^{14}$ cm$^{-3}$, for example.

A depth of the $p^+$-type diffusion region 120 is 5 μm, for example, and the impurity concentration in the surface of the $p^+$-type diffusion region 120 is $1\times10^{16}$ to $1\times10^{19}$ cm$^{-3}$, for example. The $p^+$-type diffusion region 120 has a circular shape as viewed in a plan view, and has a diameter of 10 μm, for example. The respective $p^+$-type diffusion regions 120 are arranged at positions corresponding to vertexes of a hexagonal shape as viewed in a plan view, for example. A rate of areas where the $p^+$-type diffusion regions 120 are formed with respect to the whole area of an active region is 40%, for example.

The barrier metal layer 130 is made of aluminum, for example. A thickness of the barrier metal layer 130 is 1 μm, for example. The anode electrode layer 140 is made of aluminum, for example. A thickness of the anode electrode layer 140 is 5 μm, for example. The cathode electrode layer 150 is made of nickel, for example. A thickness of the cathode electrode layer 150 is 2 μm, for example.

In the semiconductor device 100 according to the embodiment 1, as shown in FIG. 1B, platinum, for example, is diffused into the semiconductor base body 110 as heavy metal such that the concentration of platinum becomes maximum in the surface of the semiconductor base body 110 on an $n^-$-type semiconductor layer 114 side.

In the semiconductor device 100 according to the embodiment 1, for example, platinum is diffused into the semiconductor base body 110 as heavy metal from a surface side of the $n^+$-type semiconductor layer 112 (see FIG. 3D and FIG. 4A described later).

B. Advantageous Effects of Semiconductor Device 100 According to Embodiment 1

The semiconductor device 100 according to the embodiment 1 has the structure where the barrier metal layer 130 is formed on the surface of the $n^-$-type semiconductor layer 114 and the surfaces of the $p^+$-type diffusion regions 120 (that is, JBS structure). Accordingly, when a reverse bias is applied to the semiconductor device 100, the whole region of the surface of the $n^-$-type semiconductor layer 114 is pinched off due to the depletion layer 160 extending toward the $n^-$-type semiconductor layer 114 from boundary surfaces between the n⁻-type semiconductor layer 114 and the p⁺-type diffusion regions 120. Accordingly, it is possible to increase a reverse withstand voltage VR, and it is also possible to lower a leak current IR.

In the semiconductor device 100 according to the embodiment 1, heavy metal (platinum) is diffused in the semiconductor base body 110 such that the concentration of heavy metal becomes maximum in the surface of the n⁻-type semiconductor layer 114 and hence, in the vicinity of the surface of the n⁻-type semiconductor layer 114, the depletion layer 160 simulatively extends in the same manner as the case where the concentration of an impurity of an n-type is lowered.

Figure 2B:
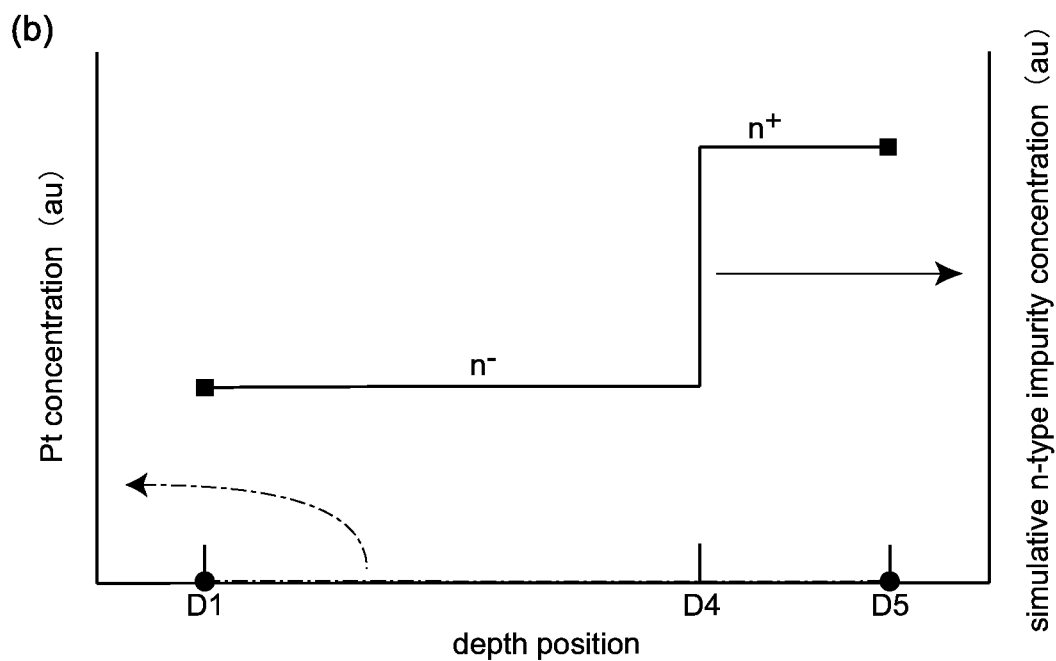

FIG. 2A and FIG. 2B are graphs for explaining a state where the concentration of an impurity of an n-type is simulatively lowered when heavy metal (platinum) is diffused into the semiconductor base body 110. FIG. 2A is the graph showing the simulative concentration of an impurity of an n-type when heavy metal (platinum) is diffused into the semiconductor base body 110, and FIG. 2B is a graph showing the concentration of an impurity of an n-type when heavy metal (platinum) is not diffused into the semiconductor base body 110. As can be understood from FIG. 2A and FIG. 2B, the concentration of an impurity of an n-type is simulatively lowered when heavy metal (platinum) is diffused.

Figure 18A:
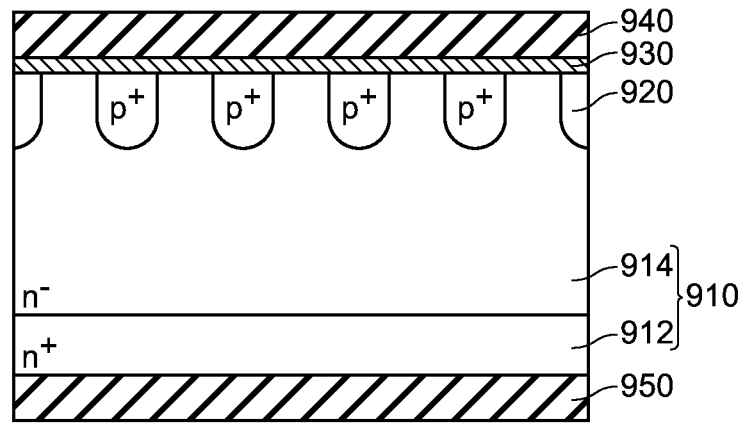
FIG. 18A and FIG. 18B are views for explaining a conventional semiconductor device 900.
Figure 18B:
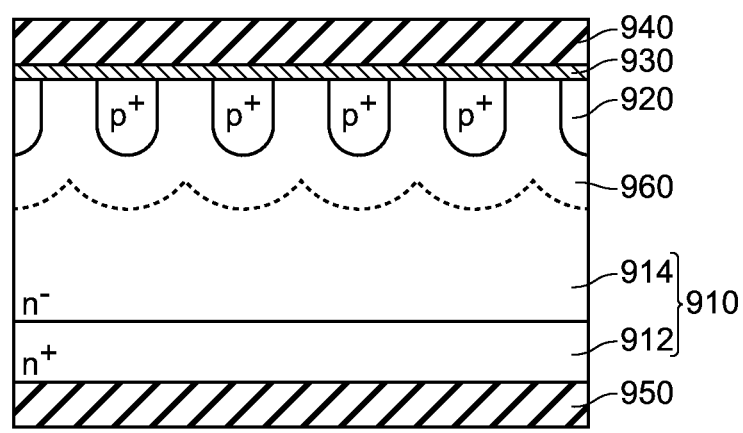
Figure 19:
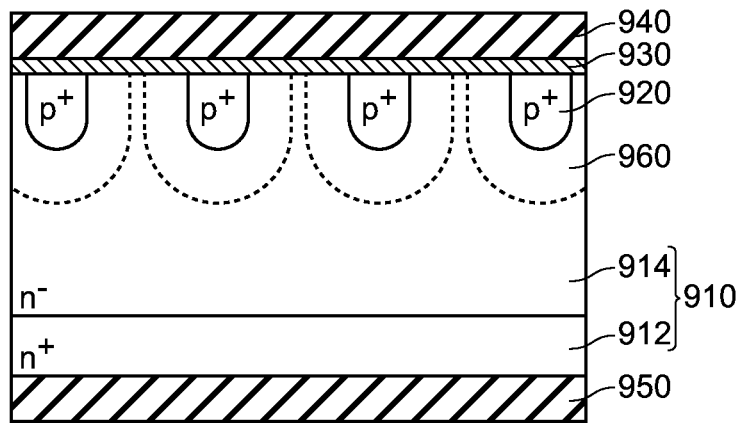
FIG. 19 is a view for explaining a drawback which the conventional semiconductor device 900 has.
Figure 20:
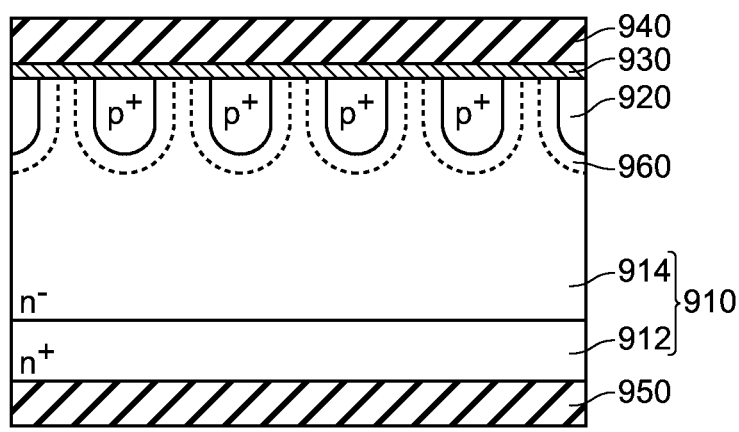
FIG. 20 is a view for explaining the drawback which the conventional semiconductor device 900 has.

Due to such a constitution, in the semiconductor device 100 according to the embodiment 1, as shown in FIG. 1C, the whole region of the surface of the n⁻-type semiconductor layer 114 is easily pinched off at the time of applying a reverse bias. Accordingly, there exists no possibility that a reverse withstand voltage VR is lowered or a leak current IR is increased even when a rate of an area where the p⁺-type diffusion regions 120 are formed is lowered (see FIG. 18A, FIG. 18B and FIG. 19 showing a conventional technique) or even when the concentration of an impurity of an n-type in the n⁻-type semiconductor layer 114 is increased (see FIG. 18A, FIG. 18B and FIG. 20 showing a conventional technique). In this manner, in the semiconductor device 100 according to the embodiment 1, a forward drop voltage VF can be lowered and a reverse recovery time trr can be shortened while maintaining a high reverse withstand voltage VR and a low leak current IR compared to the conventional semiconductor device 900.

As a result, according to the semiconductor device 100 of the embodiment 1, it is possible to provide a semiconductor device which can lower a forward drop voltage VF and can shorten a reverse recovery time trr while maintaining a high reverse withstand voltage VR and a low leak current IR.

In the semiconductor device 100 according to the embodiment 1, a reverse withstand voltage VR can be increased and hence, it is possible to decreased a thickness of the n⁻-type semiconductor layer 114. Also from this point of view, a forward drop voltage VF can be lowered, and a reverse recovery time trr can be shortened.

In the semiconductor device 100 according to the embodiment 1, heavy metal (platinum) is diffused into the semiconductor base body 110 such that the concentration of heavy metal becomes maximum in the surface of the n⁻-type semiconductor layer 114. Accordingly, although a carrier extinction speed is increased in the surface of the n⁻-type semiconductor layer 114, a carrier extinction speed is not increased so much in a bottom portion of the n⁻-type semiconductor layer 114 (in the vicinity of a boundary surface between the n⁻-type semiconductor layer 114 and the n⁺-type semiconductor layer 112) and hence, noises generated at the time of switching off the semiconductor device 100 is decreased thus providing a semiconductor device having an excellent soft recovery characteristic.

C. Method of Manufacturing Semiconductor Device According to Embodiment 1

The semiconductor device 100 according to the embodiment 1 can be manufactured by a method of manufacturing a semiconductor device explained hereinafter. FIG. 3A to FIG. 3D and FIG. 4A to FIG. 4D are views for explaining the method of manufacturing a semiconductor device according to the embodiment 1. FIG. 3A to FIG. 3D and FIG. 4A to FIG. 4D are views showing the respective steps of the manufacturing method.

The method of manufacturing a semiconductor device according to the embodiment 1 includes, as shown in FIG. 3A to FIG. 3D and FIG. 4A to FIG. 4D: a semiconductor base body preparing step; a p⁺-type diffusion region forming step (a high-concentration diffusion region forming step); a heavy metal diffusion source layer forming step; a heavy metal diffusing step; a barrier metal layer forming step; an anode electrode layer forming step; and a cathode electrode layer forming step in this order. Hereinafter, these steps are explained in accordance with the sequence of steps.

1. Semiconductor Base Body Preparing Step

Figure 3A:
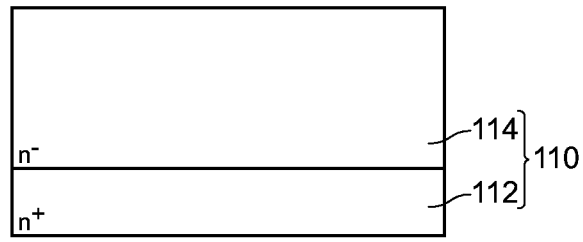
FIG. 3A to FIG. 3D are views for explaining a method of manufacturing a semiconductor device according to the embodiment 1.

As shown in FIG. 3A, the semiconductor base body preparing step is a step for preparing the semiconductor base body 110 which has the structure where the n⁺-type semiconductor layer 112 and the n⁻-type semiconductor layer 114 formed on the n⁺-type semiconductor layer 112 by an epitaxial growth method are laminated to each other in this order. As the semiconductor base body 110, a silicon substrate having a thickness of 400 μm is used, for example. A thickness of the n⁺-type semiconductor layer 112 is 350 μm, for example, and an impurity concentration in the n⁺-type semiconductor layer 112 is $1 \times 10^{19}$ cm⁻³, for example. A thickness of the n⁻-type semiconductor layer 114 is 50 μm, for example, and an impurity concentration in the n⁻-type semiconductor layer 114 is $1 \times 10^{14}$ cm⁻³, for example.

2. p⁺-Type Diffusion Region Forming Step (High-Concentration Diffusion Region Forming Step)

Figure 3B:
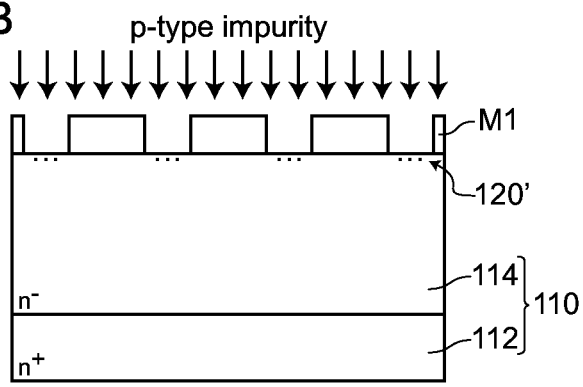
Figure 3C:
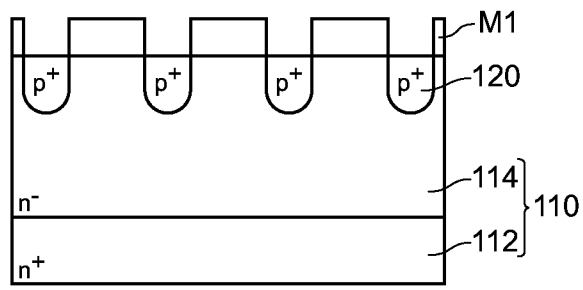
Figure 3D:
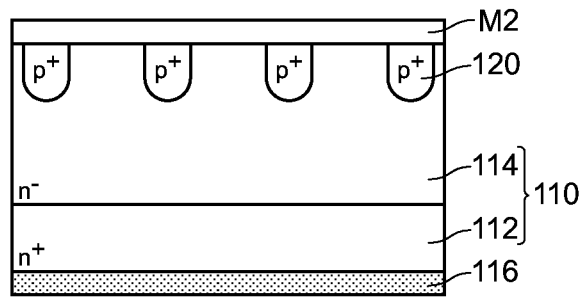

As shown in FIG. 3B and FIG. 3C, the p⁺-type diffusion region forming step is a step for selectively forming the p⁺-type diffusion regions 120 containing an impurity of a p-type at a concentration higher than a concentration of an impurity of an n-type which the n⁻-type semiconductor layer 114 contains on the surface of the n⁻-type semiconductor layer 114.

Firstly, a mask M1 formed of a silicon oxide film having a thickness of 800 nm, for example, is formed on a surface (a first main surface side surface) of the n⁻-type semiconductor layer 114. Thereafter, as shown in FIG. 3B, an impurity of a p-type (boron, for example) is introduced into the surface of the n⁻-type semiconductor layer 114 by a method such as an ion implantation method or a deposition method using the mask M1 thus forming p-type impurity introduced regions 120'. Thereafter, the impurity of a p-type is activated by applying thermal treatment (1000 C.°, for example) to the semiconductor base body 110 so that the p⁺-type diffusion regions 120 are formed as shown in FIG. 3C.

A depth of the p⁺-type diffusion region 120 is 5 μm, for example, and the impurity concentration in a surface of the p⁺-type diffusion region 120 is $1 \times 10^{16}$ to $1 \times 10^{19}$ cm⁻³, for example. Further, the p⁺-type diffusion region 120 has a circular shape as viewed in a plan view, and has a diameter of 10 μm, for example. The respective p⁺-type diffusion regions 120 are arranged at positions corresponding to vertexes of a hexagonal shape as viewed in a plan view, for example. Further, a rate of an area where the p$^+$-type diffusion regions 120 are formed with respect to the whole area of the active region is 40%, for example.

3. Heavy Metal Diffusion Source Layer Forming Step

The heavy metal diffusion source layer forming step is a step for forming a heavy metal diffusion source layer 116 on an n$^+$-type-semiconductor-layer-112-side surface of the semiconductor base body 110.

Firstly, an oxide film (not shown in the drawing) and the mask M1 which are formed on both surfaces of the semiconductor base body 110 in the p$^+$-type diffusion region forming step are removed. Thereafter, a mask M2 formed of a silicon oxide film having a thickness of 2 μm, for example, is formed on an n$^-$-type semiconductor layer 114 side of the semiconductor base body 110. Thereafter, as shown in FIG. 3D, a coating liquid for forming a heavy metal diffusion source layer is applied to the n$^+$-type-semiconductor-layer-112-side surface of the semiconductor base body 110 by spinner coating thus forming the heavy metal diffusion source layer 116. As a coating liquid for forming a heavy metal diffusion source layer, a coating liquid for forming a silicon oxide film coating prepared by dissolving a silicon compound and additives (a platinum impurity for diffusion, a glassy material forming agent, an organic binder) into an alcoholic organic solvent is used. In this step, the mask M2 may be formed on the mask M1 without removing the mask M1.

4. Heavy Metal Diffusing Step

The heavy metal diffusing step is a step for diffusing heavy metal (platinum) into the inside of the semiconductor base body 110 from the heavy metal diffusion source layer 116 by applying thermal treatment to the semiconductor base body 110. The concentration distribution of heavy metal along the depth direction of the semiconductor base body 110 after the heavy metal diffusing step becomes the U-shaped distribution where the concentration of heavy metal becomes high in the first main surface (surface of the n$^-$-type semiconductor layer 114) and the second main surface (surface of the n$^+$-type semiconductor layer 112) of the semiconductor base body 110. Accordingly, in the n$^-$-type semiconductor layer 114, the concentration of heavy metal (platinum) becomes maximum in the surface of the n$^-$-type semiconductor layer 114.

Figure 4A:
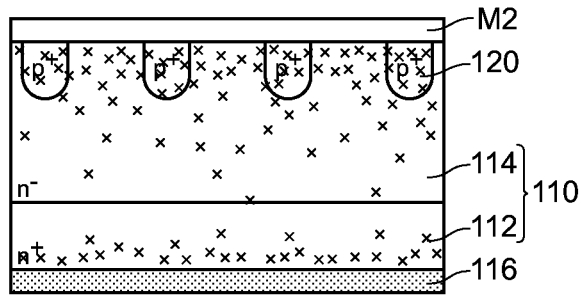
FIG. 4A to FIG. 4D are views for explaining the method of manufacturing a semiconductor device according to the embodiment 1.

When the thermal treatment is applied to the semiconductor base body 110 to which a coating liquid for forming a heavy metal diffusion source layer is applied by spinner coating at a temperature of 900 C.° for 40 min, as shown in FIG. 4A and FIG. 1B, heavy metal (platinum) is diffused into the n$^-$-type semiconductor layer 114 such that the concentration of heavy metal becomes maximum in the surface of the n$^-$-type semiconductor layer 114.

Figure 4B:
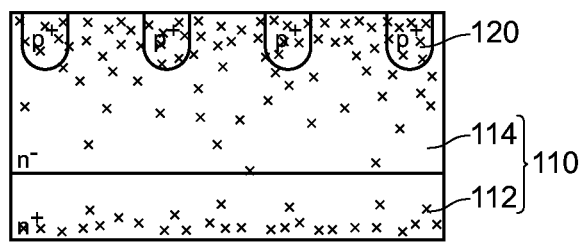

Thereafter, by etching using a hydrofluoric acid, the mask M2 on an n$^-$-type semiconductor layer 114 side of the semiconductor base body 110, and an oxidation modified layer of the heavy metal diffusion source layer 116 on an n$^+$-type semiconductor layer-112 side of the semiconductor base body 110 are removed (see FIG. 4B).

5. Barrier Metal Layer Forming Step

The barrier metal layer forming step is a step for forming the barrier metal layer 130 on the surface of the n$^-$-type semiconductor layer 114 and the surfaces of the p$^+$-type diffusion regions 120. The barrier metal layer 130 forms a Schottky junction between the barrier metal layer 130 and the n$^-$-type semiconductor layer 114, and forms an ohmic junction between the barrier metal layer 130 and the p$^+$-type diffusion regions 120 (see FIG. 4C).

A material for forming the barrier metal layer 130 is aluminum, for example, and a thickness of the barrier metal layer 130 is 1 μm, for example.

6. Anode Electrode Layer Forming Step

The anode electrode layer forming step is a step for forming the anode electrode layer 140 on the barrier metal layer 130.

Figure 4C:
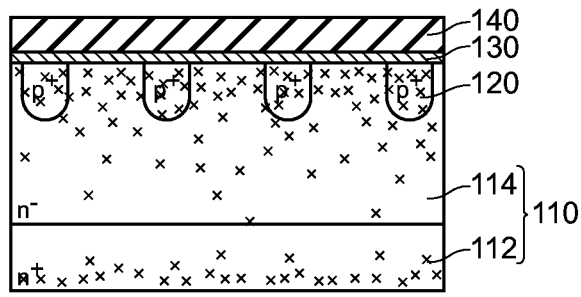

The anode electrode layer 140 made of aluminum is formed on a surface of an electrode layer formed of the barrier metal layer 130 (see FIG. 4C). A thickness of the anode electrode layer 140 is 5 μm, for example.

7. Cathode Electrode Layer Forming Step

The cathode electrode layer forming step is a step for forming the cathode electrode layer 150 on the surface of the n$^+$-type semiconductor layer 112.

Figure 4D:
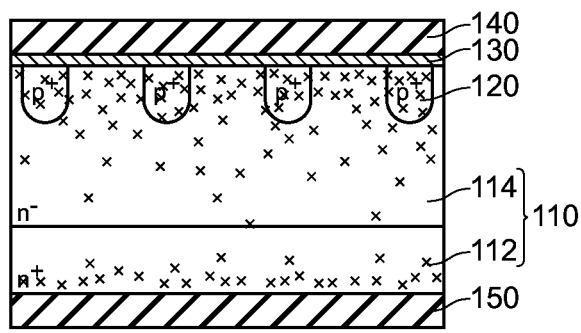

A cathode electrode layer made of nickel, for example, is formed on the surface of the n$^+$-type semiconductor layer 112 (see FIG. 4D). A thickness of the cathode electrode layer 150 is 2 μm, for example.

By carrying out the method of manufacturing a semiconductor device according to the embodiment 1 including the above-mentioned steps, the semiconductor device 100 according to the embodiment 1 can be manufactured.

[Modification 1]

FIG. 5A to FIG. 5D are views for explaining a method of manufacturing a semiconductor device according to a modification 1 of the embodiment 1. FIG. 5A to FIG. 5D are views showing respective steps of the method. In the method of manufacturing a semiconductor device according to the modification 1 of the embodiment 1, steps following a heavy metal diffusion source layer forming step (see FIG. 3D to FIG. 4D) are substantially equal to the corresponding steps in the method of manufacturing a semiconductor device according to the embodiment 1 and hence, the illustrations of the steps corresponding to the steps shown in FIG. 3D to FIG. 4D are omitted.

Although the method of manufacturing a semiconductor device according to the modification 1 of the embodiment 1 basically includes the substantially same steps as the method of manufacturing a semiconductor device according to the embodiment 1, the modification 1 differs from the embodiment 1 with respect to a type of a semiconductor base body which is prepared in the initial step of the method.

Figure 5A:
FIG. 5A to FIG. 5D are views for explaining a method of manufacturing a semiconductor device according to a modification 1 of the embodiment 1.
Figure 5B:
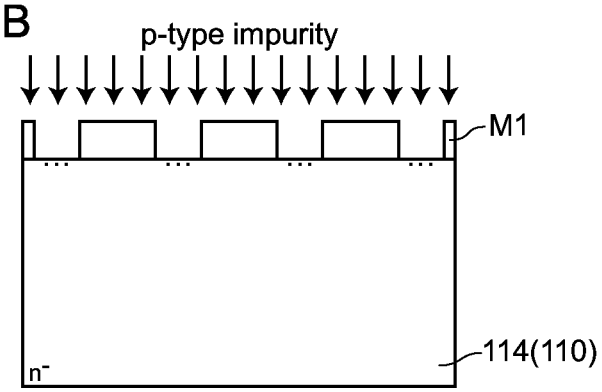
Figure 5C:
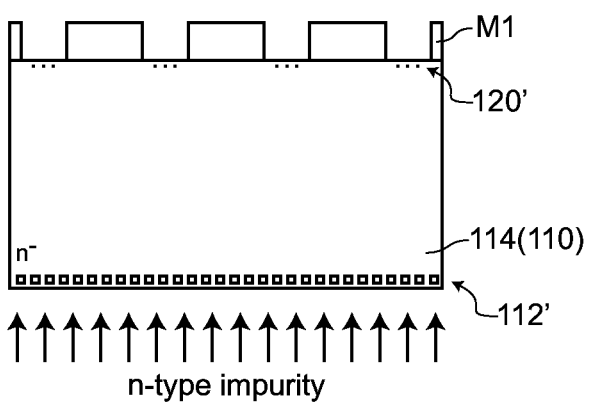
Figure 5D:
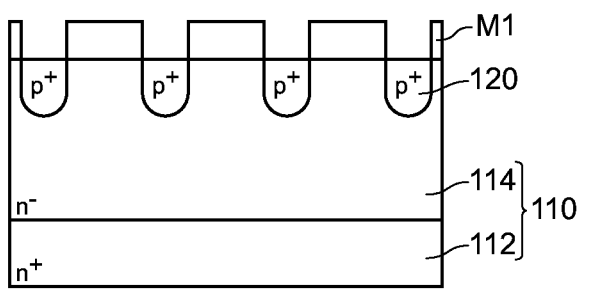

That is, in the method of manufacturing a semiconductor device according to the modification 1, as shown in FIG. 5A, in the first step, as a semiconductor base body, a semiconductor base body 110 formed of an n$^-$-type semiconductor layer 114 is prepared. Accordingly, an impurity of a p-type (boron, for example) is introduced into a surface of the n$^-$-type semiconductor layer 114 by a method such as an ion implantation method or a deposition method thus forming a p-type impurity introduced regions 120' (see FIG. 5B). Then, an impurity of an n-type (phosphorus, for example) is introduced into a surface (second-main-surface-side surface) of the n$^-$-type semiconductor layer 114 by an ion implantation method or a deposition method thus forming an impurity of an n-type introduced region 112' (see FIG. 5C). Then, the impurity of a p-type and the impurity of an n-type are activated by applying thermal treatment (1000° C., for example) to the semiconductor base body 110 thus forming p$^+$-type diffusion regions 120 and an n$^+$-type semiconductor layer 112 as shown in FIG. 5D. A depth of the formed n$^+$-type semiconductor layer 112 is 5 μm, for example.

Also due to such a method, it is possible to manufacture a semiconductor device 100a according to the modification 1 of the embodiment 1 (not shown in the drawing) which has the substantially same constitution as the semiconductor device 100 according to the embodiment 1.

[Modification 2]

Figure 6A:
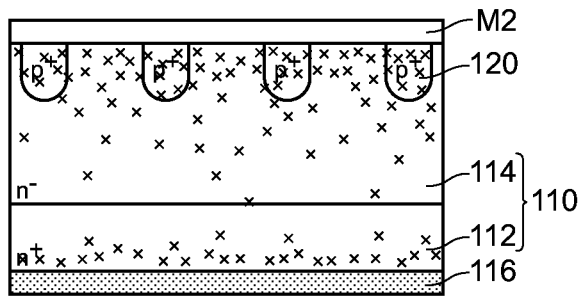
FIG. 6A and FIG. 6B are views for explaining a method of manufacturing a semiconductor device according to a modification 2 of the embodiment 1.
Figure 6B:
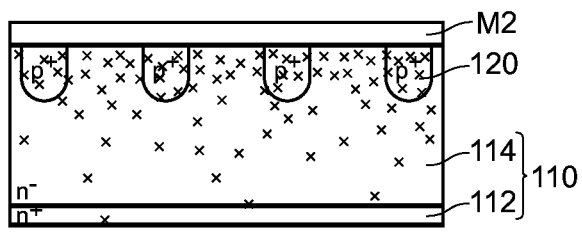
Figures 7A, 7B:
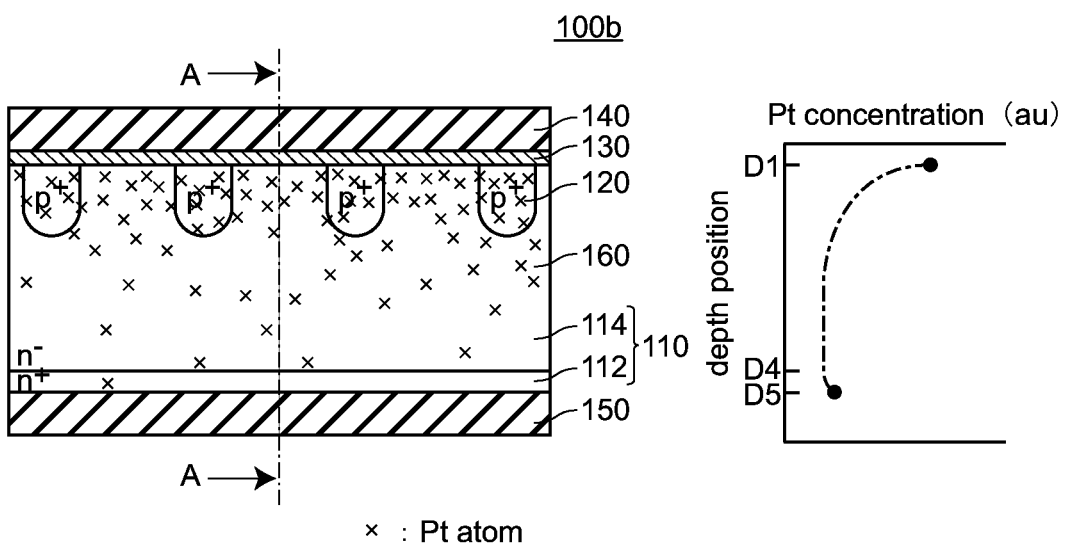
FIG. 7A and FIG. 7B are views for explaining a semiconductor device 100b according to the modification 2 of the embodiment 1.

FIG. 6A and FIG. 6B are views for explaining a method of manufacturing a semiconductor device according to a modification 2 of the embodiment 1. FIG. 6A and FIG. 6B are views showing respective steps of the method. FIG. 7A and FIG. 7B are views for explaining a semiconductor device 100b according to the modification 2 of the embodiment 1. FIG. 7A is a cross-sectional view of the semiconductor device 100b, and FIG. 7B is a graph showing the concentration distribution of heavy metal (platinum) in the semiconductor base body 110. In the method of manufacturing a semiconductor device according to the modification 2 of the embodiment 1, steps up to a heavy metal diffusion source layer forming step (see FIG. 3A to FIG. 3C) and steps following a barrier metal layer forming step (see FIG. 4C to FIG. 4D) are substantially equal to the corresponding steps in the method of manufacturing a semiconductor device according to the embodiment 1 and hence, the illustrations of the steps corresponding to the steps shown in FIG. 3A to FIG. 3C and the steps corresponding to the steps shown in FIG. 4C to FIG. 4D are omitted.

Although the method of manufacturing a semiconductor device according to the modification 2 of the embodiment 1 basically includes the substantially same steps as the method of manufacturing a semiconductor device according to the embodiment 1, the method of manufacturing a semiconductor device according to the modification 2 of the embodiment 1 differs from the method of manufacturing a semiconductor device according to the embodiment 1 with respect to a point that the method of manufacturing a semiconductor device according to the modification 2 of the embodiment 1 further includes a step of decreasing a thickness of an $n^+$-type semiconductor layer 112 (see FIG. 6B) after the heavy metal diffusion step is performed (see FIG. 6A).

That is, the method of manufacturing a semiconductor device according to the modification 2 of the embodiment 1 further includes the step of decreasing a thickness of the $n^+$-type semiconductor layer 112 by a CMP after the heavy metal diffusion step is performed. As a result of such a step, a thickness of the $n^+$-type semiconductor layer 112 becomes 5 μm, for example. Further, as shown in FIG. 7A and FIG. 7B, the concentration of heavy metal (platinum) in a surface of the $n^+$-type semiconductor layer 112 is lower than the concentration of heavy metal (platinum) in the surface of the $n^+$-type semiconductor layer 112 of the semiconductor device 100 according to the embodiment 1.

[Modification 3]

Figure 8:
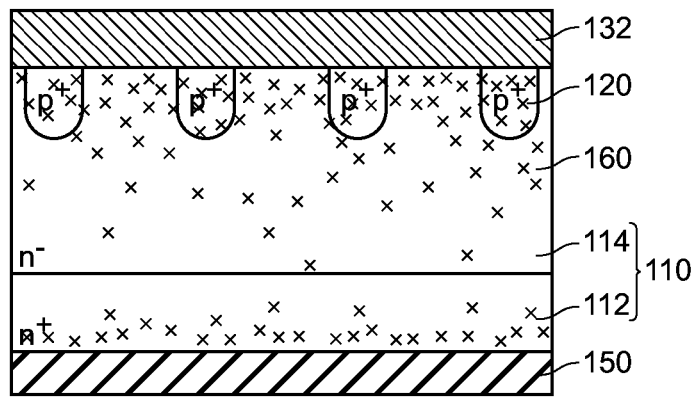
FIG. 8 is a view for explaining a semiconductor device 100c according to a modification 3 of the embodiment 1.

FIG. 8 is a view for explaining a semiconductor device 100c according to a modification 3 of the embodiment 1.

Although the semiconductor device 100c according to the modification 3 of the embodiment 1 basically has the substantially same constitution as the semiconductor device 100 according to the embodiment 1, the semiconductor device 100c according to the modification 3 of the embodiment 1 differs from the semiconductor device 100 according to the embodiment 1 with respect to the constitution on a first main surface side.

That is, in the semiconductor device 100c according to the modification 3, a barrier metal layer 132 which is formed on a first main surface side functions also as an anode electrode layer (see FIG. 8). The barrier metal layer 132 is made of aluminum, for example. A thickness of the barrier metal layer 132 is 6 μm, for example.

The semiconductor device 100c according to the modification 3 of the embodiment 1 having such a constitution is also embraced in the semiconductor device of the present invention in the same manner as the semiconductor device 100 according to the embodiment 1.

Embodiment 2

A. Semiconductor Device 102 According to Embodiment 2

Figure 9A:
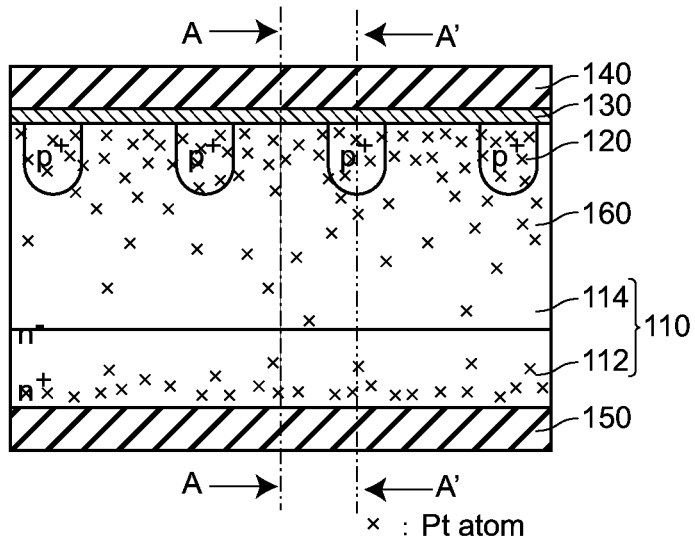
FIG. 9A and FIG. 9B are views for explaining a semiconductor device 102 according to an embodiment 2.
Figure 9B:
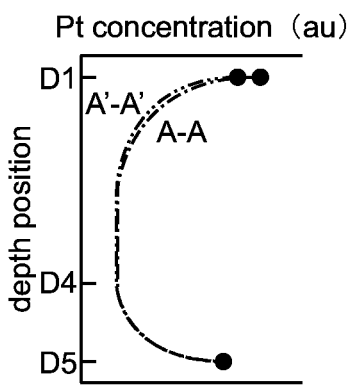

FIG. 9A and FIG. 9B are views for explaining a semiconductor device 102 according to an embodiment 2. FIG. 9A is a cross-sectional view of the semiconductor device 102, and FIG. 9B is a graph showing the concentration distribution of heavy metal (platinum) in a semiconductor base body 110.

Although the semiconductor device 102 according to the embodiment 2 basically has the substantially same constitution as the semiconductor device 100 according to the embodiment 1, the semiconductor device 102 according to the embodiment 2 differs from the semiconductor device 100 according to the embodiment 1 with respect to the concentration distribution of heavy metal (platinum) in the semiconductor base body 110.

That is, as shown in FIG. 9A to FIG. 9B, the semiconductor device 102 according to the embodiment 2 differs from the semiconductor device 100 according to the embodiment 1 with respect to the concentration distribution of heavy metal (platinum) in the semiconductor base body 110. That is, the concentration of heavy metal (platinum) in a surface of an $n^-$-type semiconductor layer 114 (see a curve drawn by a chain line in FIG. 9B) is higher than the concentration of heavy metal (platinum) in a surface of a $p^+$-type diffusion region 120 (see a curve drawn by a double-dashed chain line in FIG. 9B).

In this manner, although the semiconductor device 102 according to the embodiment 2 differs from the semiconductor device 100 according to the embodiment 1 with respect to the concentration distribution of heavy metal (platinum) in the semiconductor base body 110, in the same manner as the semiconductor device 100 according to the embodiment 1, the semiconductor device 102 has the structure where a barrier metal layer 130 is formed on a surface of the $n^-$-type semiconductor layer 114 and surfaces of $p^+$-type diffusion regions 120 (that is, the JBS structure) and, further, heavy metal (platinum) is diffused in the semiconductor base body 110 such that the concentration of heavy metal becomes maximum in the surface of the $n^-$-type semiconductor layer 114. Accordingly, it is possible to provide a semiconductor device which can lower a forward drop voltage VF and can shorten a reverse recovery time trr while maintaining a high reverse withstand voltage VR and a low leak current IR. Further, in the semiconductor device 102 according to the embodiment 2, a reverse withstand voltage VR can be increased and hence, a thickness of the $n^-$-type semiconductor layer 114 can be decreased. Also from this point of view, a forward drop voltage VF can be lowered and a reverse recovery time trr can be shortened.

In the semiconductor device 102 according to the embodiment 2, heavy metal (platinum) is diffused such that the concentration of heavy metal (platinum) becomes maximum in the surface of the $n^-$-type semiconductor layer 114. Accordingly, although a carrier extinction speed is increased in the surface of the $n^-$-type semiconductor layer 114, a carrier extinction speed is not increased so much in a bottom portion of the $n^-$-type semiconductor layer 114 (in the vicinity of a boundary surface between the $n^-$-type semiconductor layer 114 and the $n^+$-type semiconductor layer 112) and hence, noises generated at the time of switching off the semiconductor device 102 is decreased thus providing a semiconductor device having an excellent soft recovery characteristic.

In the semiconductor device 102 according to the embodiment 2, the concentration of heavy metal (platinum) in the surface of the n⁻-type semiconductor layer 114 is higher than the concentration of heavy metal (platinum) in the surfaces of the p⁺-type diffusion regions 120 and hence, when a reverse bias is applied to the semiconductor device 102, a depletion layer extends earlier compared to the semiconductor device 100 according to the embodiment 1 (from a point of time at which a low voltage is applied to the semiconductor device 102). Accordingly, in the semiconductor device 102 according to the embodiment 2, the whole region of the surface of the n⁻-type semiconductor layer 114 can be more easily pinched off at the time of applying a reverse bias to the semiconductor device 102 and hence, a reverse withstand voltage VR can be further increased.

The semiconductor device 102 according to the embodiment 2 has the substantially same constitution as the semiconductor device 100 according to the embodiment 1 with respect to points other than the concentration distribution of heavy metal (platinum) in the semiconductor base body 110. Accordingly, out of the advantageous effects which the semiconductor device 100 of the embodiment 1 acquires, the semiconductor device 102 of the embodiment 2 acquires the same advantageous effects as the semiconductor device 100 of the embodiment 1 with respect to the constitutions of the semiconductor device 102 of the embodiment 2 substantially equal to the corresponding constitutions of the semiconductor device 100 of the embodiment 1.

B. Method of Manufacturing Semiconductor Device According to Embodiment 2

The semiconductor device 102 according to the embodiment can be manufactured by a method of manufacturing a semiconductor device explained hereinafter (method of manufacturing a semiconductor device according to the embodiment 2).

FIG. 10A to FIG. 10D are views for explaining the method of manufacturing a semiconductor device according to the embodiment 2. FIG. 10A to FIG. 10D are views showing respective steps of the method. In the method of manufacturing a semiconductor device according to the embodiment 2, steps up to a p⁺-type diffusion region forming step (see FIG. 3A to FIG. 3C) and steps following a heavy metal diffusion step (see FIG. 4B to FIG. 4D) are substantially equal to the corresponding steps in the method of manufacturing a semiconductor device according to the embodiment 1 and hence, the illustrations of the steps corresponding to the steps shown in FIG. 3A to FIG. 3C and the steps corresponding to the steps shown in FIG. 4B to FIG. 4D are omitted.

Although the method of manufacturing a semiconductor device according to the embodiment 2 basically includes the substantially same steps as the method of manufacturing a semiconductor device according to the embodiment 1, the method of manufacturing a semiconductor device according to the embodiment 2 further includes a second heavy metal diffusion source layer forming step where a second heavy metal diffusion source layer 118 is formed on an n⁻ type-semiconductor-layer-114-side surface of the semiconductor base body 110 (particularly on the surface of the n⁻-type semiconductor layer 114) between the p⁺-type diffusion region forming step and the heavy metal diffusion step.

Figure 10A:
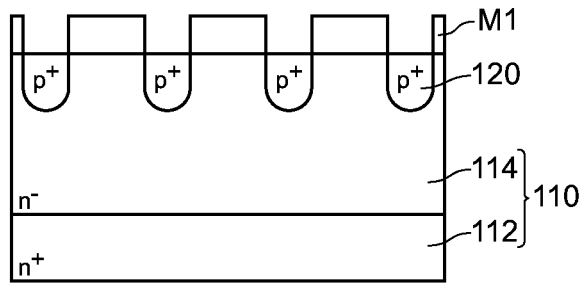
FIG. 10A to FIG. 10D are views for explaining a method of manufacturing a semiconductor device according to the embodiment 2.
Figure 10B:
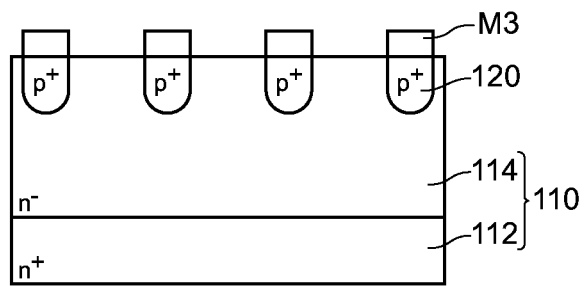
Figure 10C:
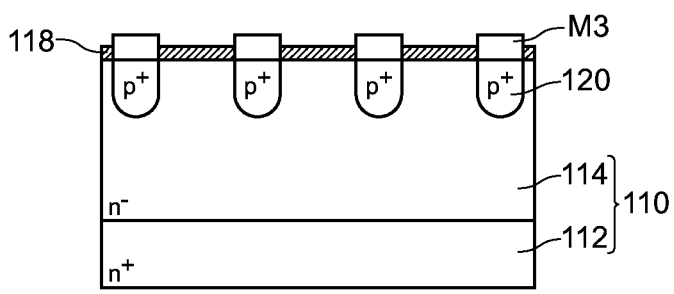
Figure 10D:
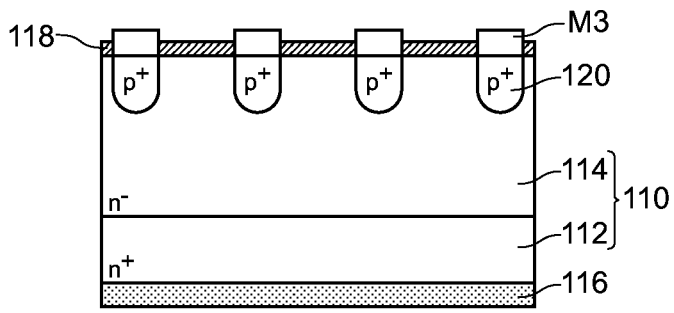

That is, in the method of manufacturing a semiconductor device according to the embodiment 2, after the p⁺-type diffusion region forming step is performed (see FIG. 10A), out of the surfaces of the n⁻-type semiconductor layer 114 and the p⁺-type diffusion regions 120, the second heavy metal diffusion source layer (platinum layer formed by a vapor deposition method or a sputtering method, for example) 118 is formed on the surface of the n⁻-type semiconductor layer 114 (see FIG. 10B to FIG. 10C). In FIG. 10A to FIG. 10D, symbol M3 indicates a mask formed of a silicon oxide film having a thickness of 2 μm, for example. Thereafter, as shown in FIG. 10D, the heavy metal diffusion step is performed after the heavy metal diffusion source layer 116 is formed. Accordingly, in the n⁻-type semiconductor layer 114 out of the n⁻-type semiconductor layer 114 and the p⁺-type diffusion regions 120, heavy metal (platinum) is diffused from both surfaces (both back and front surfaces), that is, the surface of the n⁺-type semiconductor layer 112 and the surface of the n⁻-type semiconductor layer 114 and hence, the concentration of heavy metal (platinum) in the surface of the n⁻-type semiconductor layer 114 becomes higher than the concentration of heavy metal (platinum) in the surface of the p⁺-type diffusion regions.

Due to such a method, the semiconductor device 102 according to the embodiment 2 can be manufactured.

Embodiment 3

A. Semiconductor Device 104 According to Embodiment 3

Figure 11A:
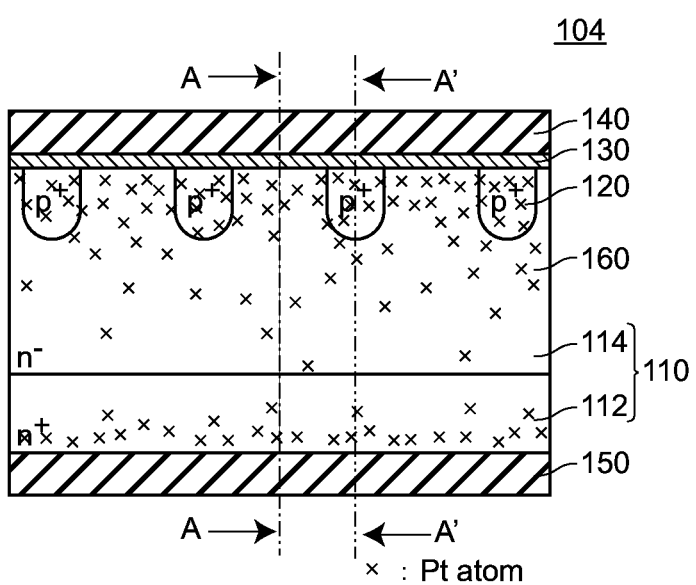
FIG. 11A and FIG. 11B are views for explaining a semiconductor device 104 according to an embodiment 3.
Figure 11B:
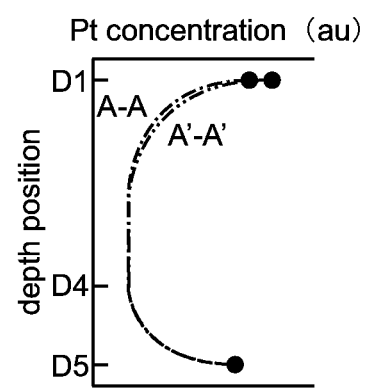

FIG. 11A and FIG. 11B are views for explaining a semiconductor device 104 according to an embodiment 3. FIG. 11A is a cross-sectional view of the semiconductor device 104, and FIG. 11B is a graph showing the concentration distribution of heavy metal (platinum) in a semiconductor base body 110.

Although the semiconductor device 104 according to the embodiment 3 basically has the substantially same constitution as the semiconductor device 100 according to the embodiment 1, the semiconductor device 104 according to the embodiment 3 differs from the semiconductor device 100 according to the embodiment 1 with respect to the concentration distribution of heavy metal (platinum) in the semiconductor base body 110.

That is, as shown in FIG. 11A and FIG. 11B, the semiconductor device 104 according to the embodiment 3 differs from the semiconductor device 100 according to the embodiment 1 with respect to the concentration distribution of heavy metal (platinum) in the semiconductor base body 110. That is, the concentration of heavy metal (platinum) in a surface of a p⁺-type diffusion region 120 (see a curve indicated by a double-dashed chain line in FIG. 11B) is higher than the concentration of heavy metal (platinum) in a surface of an n⁻-type semiconductor layer 114 (see a curve indicated by a chain line in FIG. 11B).

In this manner, although the semiconductor device 104 according to the embodiment 3 differs from the semiconductor device 100 according to the embodiment 1 with respect to the concentration distribution of heavy metal (platinum) in the semiconductor base body 110, in the same manner as the semiconductor device 100 according to the embodiment 1, the semiconductor device 104 has the structure where a barrier metal layer 130 is formed on a surface of the n⁻-type semiconductor layer 114 and surfaces of the p⁺-type diffusion regions 120 (that is, the JBS structure) and, further, heavy metal (platinum) is diffused in the semiconductor base body 110 such that the concentration of heavy metal becomes maximum in the surface of the n⁻-type semiconductor layer 114. Accordingly, it is possible to provide a semiconductor device which can lower a forward drop voltage VF and can shorten a reverse recovery time trr while maintaining a high reverse withstand voltage VR and a low leak current IR. Further, in the semiconductor device 104 according to the embodiment 3, a reverse withstand voltage VR can be increased and hence, a thickness of the n⁻-type semiconductor layer 114 can be decreased. Also from this point of view, a forward drop voltage VF can be lowered, and a reverse recovery time trr can be shortened.

In the semiconductor device 104 according to the embodiment 3, heavy metal (platinum) is diffused such that the concentration of heavy metal (platinum) becomes maximum in the surface of the n⁻-type semiconductor layer 114. Accordingly, although a carrier extinction speed is increased in the surface of the n⁻-type semiconductor layer 114, a carrier extinction speed is not increased so much in a bottom portion of the n⁻-type semiconductor layer 114 (in the vicinity of a boundary surface between the n⁻-type semiconductor layer 114 and the n⁺-type semiconductor layer 112) and hence, noises generated at the time of switching off the semiconductor device 104 is decreased thus providing a semiconductor device having an excellent soft recovery characteristic.

In the semiconductor device 104 according to the embodiment 3, the concentration of heavy metal (platinum) in the surfaces of the p⁺-type diffusion regions 120 is higher than the concentration of heavy metal (platinum) in the surface of the n⁻-type semiconductor layer 114 and hence, the speed of extinguishing the small number of carriers can be increased at the time of switching off the semiconductor device 104. Accordingly, in the semiconductor device 104 according to the embodiment 3, a reverse recovery time trr can be further shortened.

The semiconductor device 104 according to the embodiment 3 has the substantially same constitution as the semiconductor device 100 according to the embodiment 1 with respect to points other than the concentration distribution of heavy metal (platinum) in the semiconductor base body 110. Accordingly, out of the advantageous effects which the semiconductor device 100 of the embodiment 1 acquires, the semiconductor device 104 of the embodiment 3 acquires the same advantageous effects as the semiconductor device 100 of the embodiment 1 with respect to the constitutions of the semiconductor device 104 of the embodiment 3 substantially equal to the corresponding constitutions of the semiconductor device 100 of the embodiment 1.

B. Method of Manufacturing Semiconductor Device According to Embodiment 3

The semiconductor device 104 according to the embodiment can be manufactured by a method of manufacturing a semiconductor device explained hereinafter (a method of manufacturing a semiconductor device according to the embodiment 3).

FIG. 12A to FIG. 12D are views for explaining the method of manufacturing a semiconductor device according to the embodiment 3. FIG. 12A to FIG. 12D are views showing respective steps of the method. In the method of manufacturing a semiconductor device according to the embodiment 3, steps up to a p⁺-type diffusion region forming step (see FIG. 3A to FIG. 3C) and steps following a heavy metal diffusion step (see FIG. 4B to FIG. 4D) are substantially equal to the corresponding steps in the method of manufacturing a semiconductor device according to the embodiment 1 and hence, the illustrations of the steps corresponding to the steps shown in FIG. 3A to FIG. 3C and the steps corresponding to the steps shown in FIG. 4B to FIG. 4D are omitted.

Although the method of manufacturing a semiconductor device according to the embodiment 3 basically includes the substantially same steps as the method of manufacturing a semiconductor device according to the embodiment 1, the method of manufacturing a semiconductor device according to the embodiment 3 further includes a second heavy metal diffusion source layer forming step where a second heavy metal diffusion source layer is formed on an n⁻ type-semiconductor-layer-114-side surface of the semiconductor base body 110 (particularly on surfaces of the p⁺-type diffusion regions 120) between the p⁺-type diffusion region forming step and the heavy metal diffusion step.

Figure 12A:
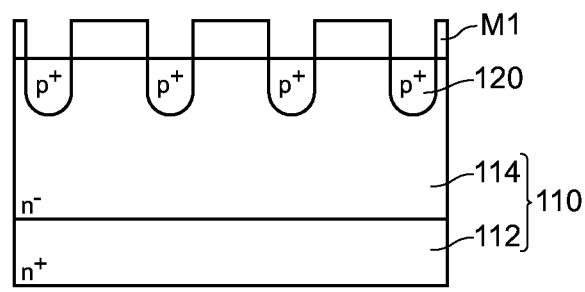
FIG. 12A to FIG. 12D are views for explaining a method of manufacturing a semiconductor device according to the embodiment 3.
Figure 12B:
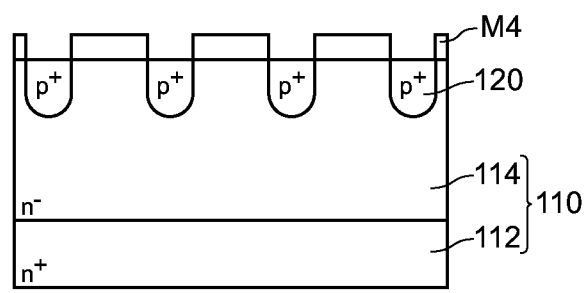
Figure 12C:
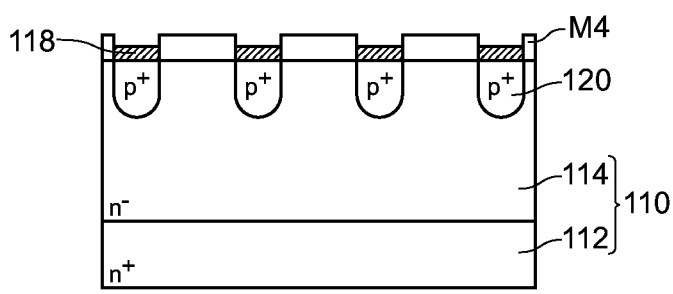
Figure 12D:
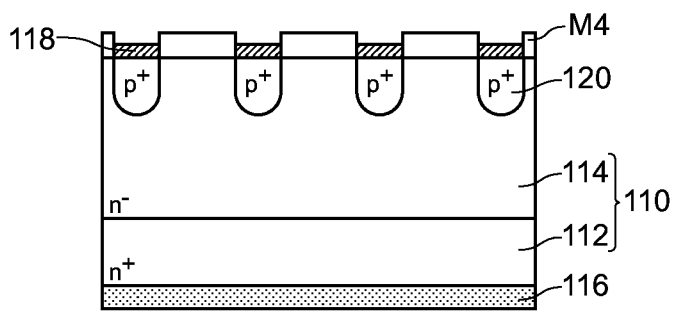

That is, in the method of manufacturing a semiconductor device according to the embodiment 3, after the p⁺-type diffusion region forming step is performed (see FIG. 12A), the second heavy metal diffusion source layer (platinum layer formed by a vapor deposition method or a sputtering method, for example) 118 is formed in surfaces of the p⁺-type diffusion regions 120 out of a surface of the n⁻-type semiconductor layer 114 and the surfaces of the p⁺-type diffusion regions 120 (see FIG. 12B to FIG. 12C). In FIG. 12A to FIG. 12D, symbol M4 indicates a mask formed of a silicon oxide film having a thickness of 2 μm, for example. Thereafter, as shown in FIG. 12D, the heavy metal diffusion step is performed after the heavy metal diffusion source layer 116 is formed. Accordingly, in the p⁺-type diffusion regions 120 out of the n⁻-type semiconductor layer 114 and the p⁺-type diffusion regions 120, heavy metal (platinum) is diffused from both surfaces (both back and front surfaces), that is, the surface of the n⁺-type semiconductor layer 112 and the surfaces of the p⁺-type diffusion regions 120 and hence, the concentration of heavy metal (platinum) in the surfaces of the p⁺-type diffusion regions 120 becomes higher than the concentration of heavy metal (platinum) in the surface of the n⁻-type semiconductor layer 114.

Due to such a method, the semiconductor device 104 according to the embodiment 3 can be manufactured.

Embodiment 4

A. Semiconductor Device 106 According to Embodiment 4

FIG. 13A to FIG. 13C are views for explaining a semiconductor device 106 according to an embodiment 4. FIG. 13A is a cross-sectional view of the semiconductor device 106, FIG. 13B is a graph showing the concentration distribution of heavy metal (platinum) in a semiconductor base body 110, and FIG. 13C is a view showing a state where a depletion layer 160 extends when a reverse bias is applied to the semiconductor device 106.

Figure 14A:
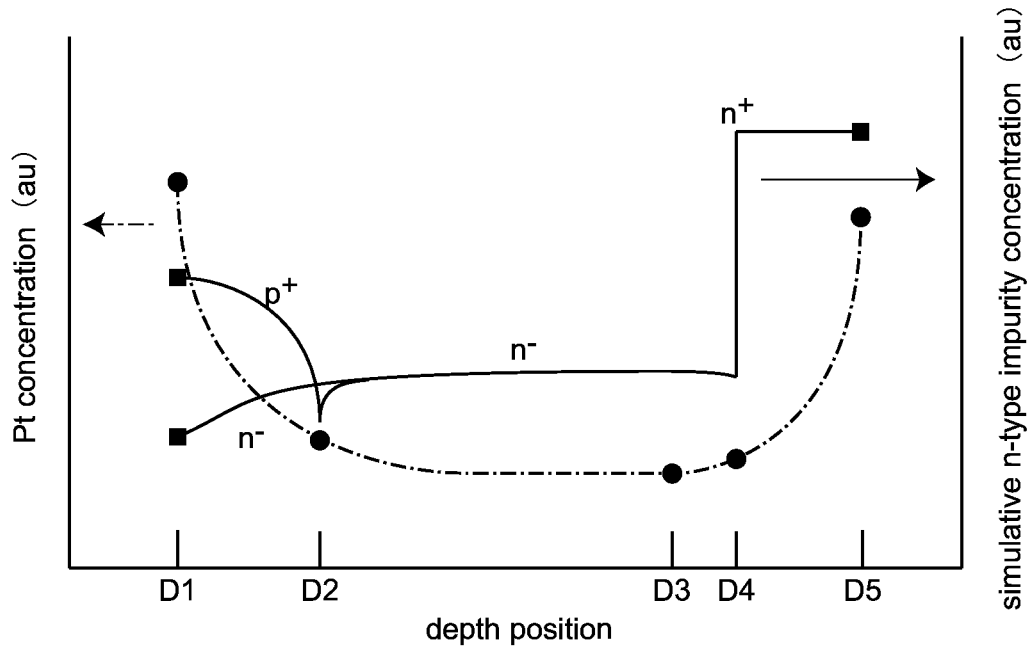
FIG. 14A is a graph showing the concentration distribution of heavy metal in the semiconductor device 106 according to the embodiment 4.
Figure 14B:
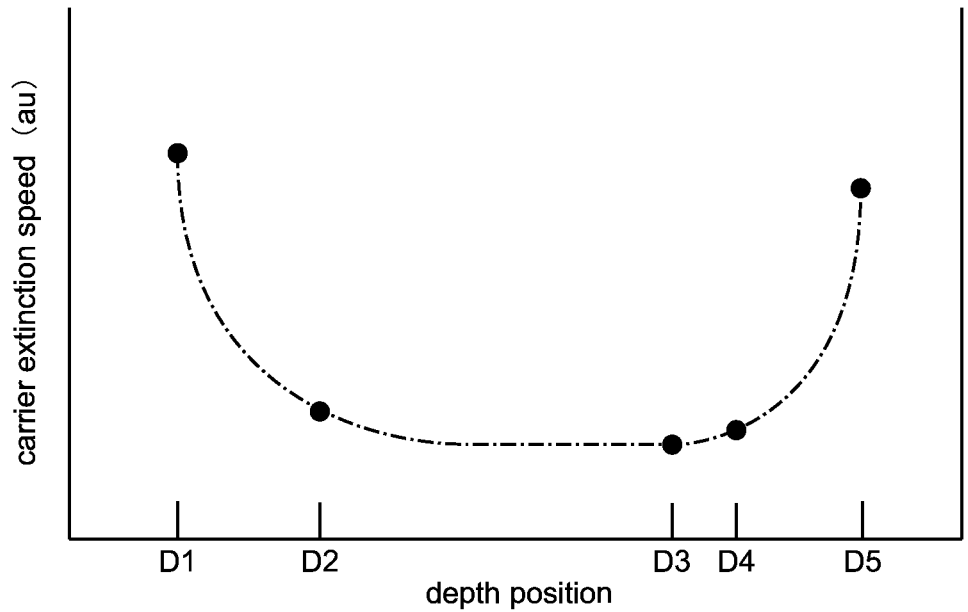
FIG. 14B is a graph showing the carrier extinction speed distribution according to the embodiment 4.

FIG. 14A and FIG. 14B are graphs showing the concentration distribution of heavy metal (platinum) in the semiconductor device 106 according to the embodiment 4 and the carrier extinction speed distribution. FIG. 14A is a graph showing the concentration distribution of heavy metal (platinum) in the semiconductor device 106 according to the embodiment 4, and FIG. 14B is a graph showing carrier extinction speed distribution.

Figure 15A:
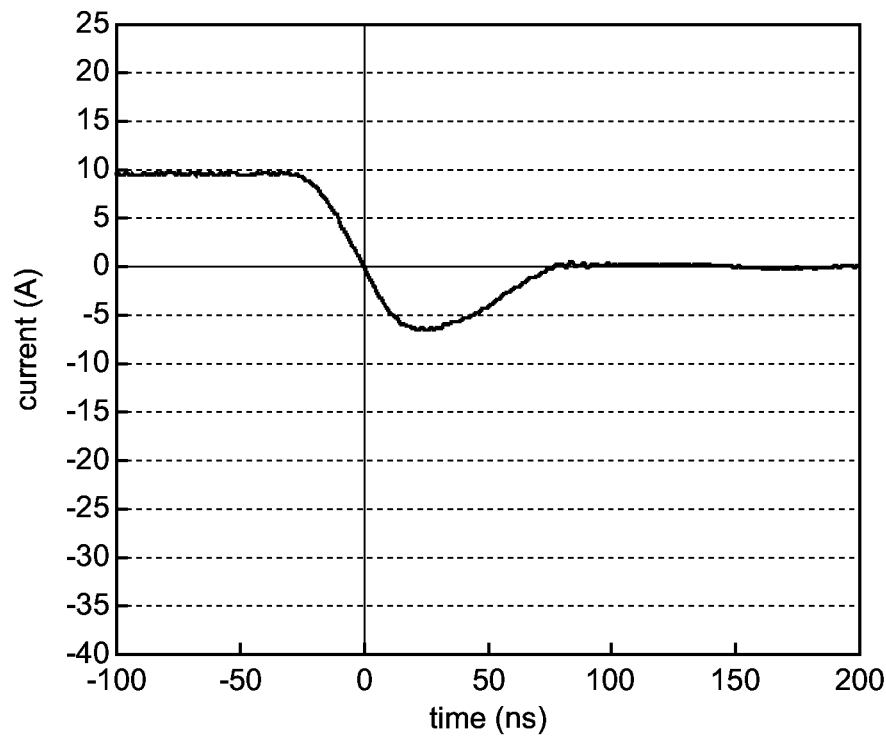
FIG. 15A and FIG. 15B are graphs for explaining the current responsiveness of the semiconductor device 106 according to the embodiment 4 at the time of switching off the semiconductor device 106.
Figure 15B:
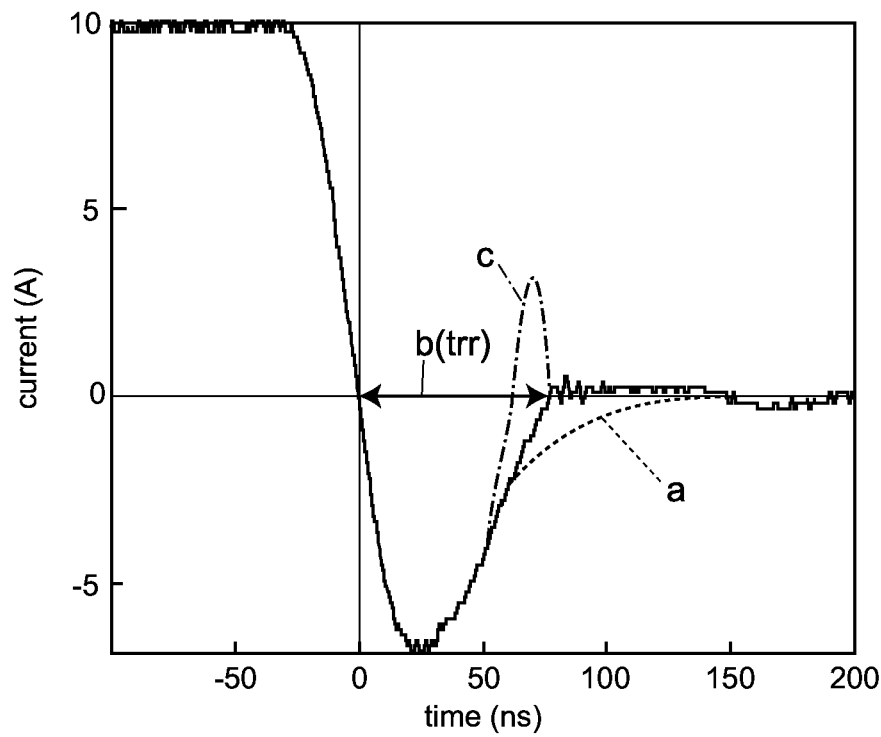

FIG. 15A and FIG. 15B are graphs showing current responsiveness of the semiconductor device 106 according to the embodiment 4 at the time of switching off the semiconductor device 106. FIG. 15A is a graph showing the whole current responsiveness, and FIG. 15B is an enlarged view of the graph shown in FIG. 15A. In FIG. 15A and FIG. 15B, symbol "a" indicates a tail current, symbol "b" indicates a reverse recovery time trr, and symbol c indicates noises generated at the time of switching off the semiconductor device 106.

Although the semiconductor device 106 according to the embodiment 4 basically has the substantially same constitution as the semiconductor device 100 according to the embodiment 1, the semiconductor device 106 according to the embodiment 4 differs from the semiconductor device 100 according to the embodiment 1 with respect to the concentration distribution of heavy metal (platinum) in the semiconductor base body 110.

That is, in the semiconductor device 106 according to the embodiment 4, as shown in FIG. 13A to FIG. 13C and FIG. 14A and FIG. 14B, assuming a depth position in the surface of the n⁻-type semiconductor layer 114 as D1, a depth position at a deepest portion in the p⁺-type diffusion region 120 as D2, a depth position deeper than the depth position D2 and shallower than a boundary surface between the n⁺-type semiconductor layer 112 and the n⁻-type semiconductor layer 114 as D3, a depth position at the boundary surface between the n⁺-type semiconductor layer 112 and the n⁻-type semiconductor layer 114 as D4, and a depth position in the surface of the n⁺-type semiconductor layer 112 as D5, the concentration of heavy metal (platinum) at the depth position D4 is higher than the concentration of heavy metal (platinum) at the depth position D3. Further, the concentration of heavy metal (platinum) at the depth position D2 is higher than the concentration of heavy metal (platinum) at the depth position D3. The depth position D3 is a depth position at which a tail current at the time of switching off the semiconductor device 100 is controllable (a depth position shallower than the depth position D4 by 10 µm, for example).

A thickness of the semiconductor base body 110 is 400 µm, for example. A thickness of the n⁺-type semiconductor layer 112 is 340 µm, for example, and the impurity concentration in the n⁺-type semiconductor layer 112 is $1 \times 10^{19}$ cm$^{-3}$, for example. A thickness of the n⁻-type semiconductor layer 114 is 55 µm or more (for example, 60 µm), and the impurity concentration in the n⁻-type semiconductor layer 114 is $1 \times 10^{14}$ cm$^{-3}$, for example.

In this manner, although the semiconductor device 106 according to the embodiment 4 differs from the semiconductor device 100 according to the embodiment 1 with respect to the concentration distribution of heavy metal (platinum) in the semiconductor base body 110, in the same manner as the semiconductor device 100 according to the embodiment 1, the semiconductor device 106 has the structure where a barrier metal layer 130 is formed on a surface of the n⁻-type semiconductor layer 114 and surfaces of the p⁺-type diffusion regions 120 (that is, JBS structure) and, further, heavy metal (platinum) is diffused in the semiconductor base body 110 such that the concentration of heavy metal becomes maximum in the surface of the n⁻-type semiconductor layer 114. Accordingly, it is possible to provide a semiconductor device which can lower a forward drop voltage VF and can shorten a reverse recovery time trr while maintaining a high reverse withstand voltage VR and a low leak current IR. Further, in the semiconductor device 106 according to the embodiment 4, a reverse withstand voltage VR can be increased and hence, a thickness of the n⁻-type semiconductor layer 114 can be decreased. Also from this point of view, a forward drop voltage VF can be lowered, and a reverse recovery time trr can be shortened.

In the semiconductor device 106 according to the embodiment 4, heavy metal (platinum) is diffused such that the concentration of heavy metal (platinum) becomes maximum in the surface of the n⁻-type semiconductor layer 114 (see FIG. 14A). Accordingly, although a carrier extinction speed is increased in the surface of the n⁻-type semiconductor layer 114, a carrier extinction speed is not increased so much in a bottom portion of the n⁻-type semiconductor layer 114 (in the vicinity of a boundary surface between the n⁻-type semiconductor layer 114 and the n⁺-type semiconductor layer 112) (see FIG. 14B) and hence, noises generated at the time of switching off the semiconductor device 106 is decreased thus providing a semiconductor device having an excellent soft recovery characteristic.

In the semiconductor device 106 according to the embodiment 4, the concentration of heavy metal (platinum) at the depth position D4 is higher than the concentration of heavy metal (platinum) at the depth position D3 (see FIG. 14A) and hence, a carrier extinction speed at the depth position D4 becomes greater than a carrier extinction speed at the depth position D3 whereby, as shown in FIG. 15A and FIG. 15B, a tail current is decreased, and the wasteful power consumption can be decreased.

Further, in the semiconductor device 106 according to the embodiment 4, the concentration of heavy metal (platinum) at the depth position D2 is higher than the concentration of heavy metal (platinum) at the depth position D3 and hence, a carrier extinction speed in heavy metal (platinum) at the depth position D2 becomes greater than a carrier extinction speed in heavy metal (platinum) at the depth position D3. Accordingly, a recovery speed in the semiconductor device 106 is increased as a whole whereby a reverse recovery time trr can be shortened (see symbol b in FIG. 15B). On the other hand, the concentration of heavy metal (platinum) at the depth portion D3 is lower than the concentration of heavy metal (platinum) at the depth position D2 and hence, noises generated at the time of switching off the semiconductor device 106 is decreased thus providing a semiconductor device having an excellent soft recovery characteristic.

As a result, the semiconductor device 106 according to the embodiment 4 can lower a forward drop voltage VF and can shorten a reverse recovery time trr while maintaining a high reverse withstand voltage VR and a low leak current IR. The semiconductor device 106 according to the embodiment 4 also can realize the power saving and hence, it is possible to provide a semiconductor device having an excellent soft recovery characteristic.

Figure 16A:
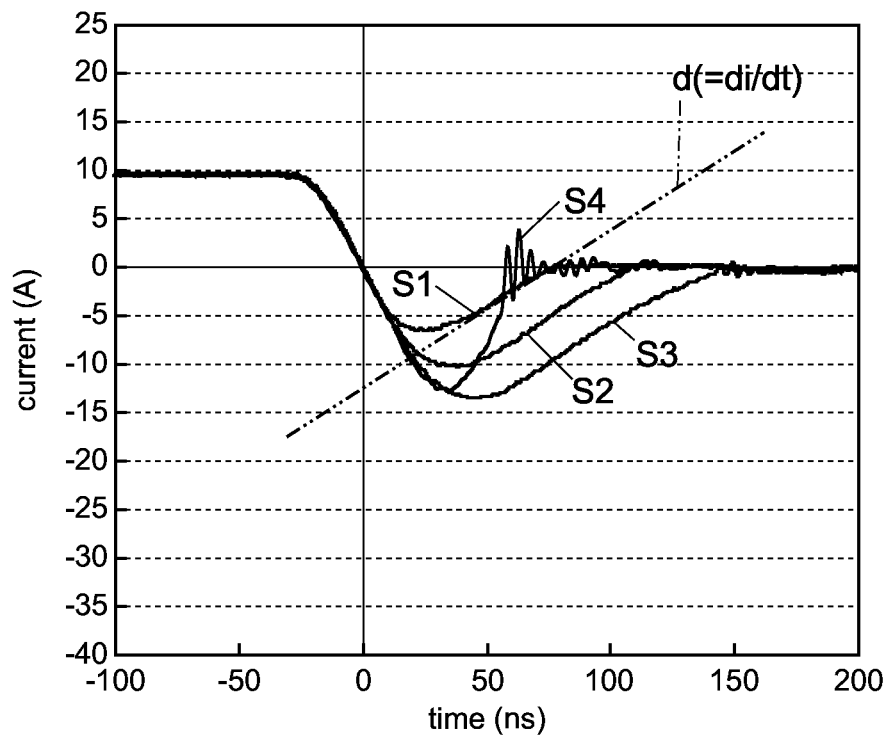
FIG. 16A is a graph showing the current responsiveness of a test example 1 and FIG. 16B is a view showing the voltage responsiveness at the time of tuning off the test example 1.
Figure 16B:
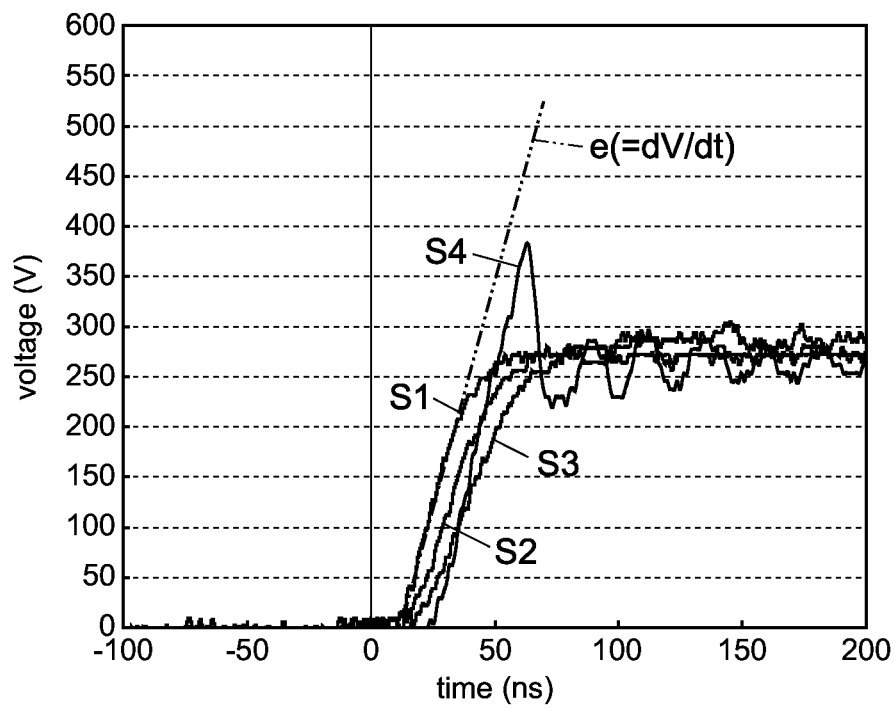

In the semiconductor device 106 according to the embodiment 4, a current change rate (di/dt, see symbol d in FIG. 16A described later) in a return gradient of a leak current IR and a voltage change rate (dV/dt, see symbol e in FIG. 16B described later) can be made gentle (see current responsiveness and voltage responsiveness indicated by symbols S1 to S3 in FIG. 16A and FIG. 16B).

Further, in the semiconductor device 106 according to the embodiment 4, by optimizing conditions in the heavy metal diffusion step, a peak value of a leak current IR and an integrated value (charge amount) Qrr of the leak current IR can be also largely decreased (see a current characteristic indicated by symbol S1 in FIG. 16A and FIG. 16B described later).

The semiconductor device 106 according to the embodiment 4 has the substantially same constitution as the semiconductor device 100 according to the embodiment 1 with respect to points other than the concentration distribution of heavy metal (platinum) in the semiconductor base body 110. Accordingly, out of the advantageous effects which the semiconductor device 100 of the embodiment 1 acquires, the semiconductor device 106 of the embodiment 4 acquires the same advantageous effects as the semiconductor device 100 of the embodiment 1 with respect to the constitutions of the semiconductor device 106 of the embodiment 4 substantially equal to the corresponding constitutions of the semiconductor device 100 of the embodiment 1.

The semiconductor device 106 according to the embodiment 4 can be basically manufactured by a method of manufacturing a semiconductor device including the substantially same steps as the method of manufacturing a semiconductor device according to the embodiment 1 (a method of manufacturing a semiconductor device according to the embodiment 4). However, in the method of manufacturing a semiconductor device according to the embodiment 4, as described above, as the semiconductor base body 110, a semiconductor base body where the $n^+$-type semiconductor layer 112 has a thickness of 340 μm, for example, and the $n^-$-type semiconductor layer 114 has a thickness of 60 μm, for example, is used.

Due to such a constitution, upon completion of the heavy metal diffusion step, it is possible to manufacture the semiconductor device 106 according to the embodiment 4 where a concentration of heavy metal (platinum) at a depth position D4 becomes higher than a concentration of heavy metal (platinum) at a depth position D3, and a concentration of heavy metal (platinum) at a depth position D2 becomes higher than a concentration of heavy metal (platinum) at a depth position D3 (see FIG. 13A to FIG. 13C).

TEST EXAMPLES

Hereinafter, the present invention is explained in more detail in conjunction with test examples.

Test Example 1

A test example 1 is a test example to prove that the semiconductor device of the present invention is a semiconductor device having an excellent soft recovery characteristic.
1. Preparation of Samples Basically, semiconductor devices having the substantially same structure as the semiconductor device according to the embodiment 4 are used as samples 1 to 3 (embodiment). The sample 1 is prepared by performing the heavy metal diffusion step at a temperature of 880° C., the sample 2 is prepared by performing the heavy metal diffusion step at a temperature of 850° C., and the sample S3 is prepared by performing the heavy metal diffusion step at a temperature of 820° C. Further, a sample 4 (comparison example) is prepared where an electron beam is irradiated in place of diffusing heavy metal as a lifetime killer.
2. Test method The recovery characteristics (current responsiveness and voltage responsiveness) when the semiconductor device is switched off such that a forward current IF is decreased at a rate of 500 A/μs from a forward bias state where a forward current IF of 10 A is made to flow are measured until a reverse voltage VR becomes 300V. The measurement is performed using a di/dt-method reverse recovery waveform testing device.
3. Test Result FIG. 16A and FIG. 16B are graphs showing responsiveness of the test example 1 at the time of switching off the samples 1 to 4. FIG. 16A is a graph showing current responsiveness at the time of switching off the samples 1 to 4, and FIG. 16B is a graph showing voltage responsiveness at the time of switching off the samples 1 to 4. In the drawings, symbol S1 indicates voltage responsiveness of the sample 1, symbol S2 indicates voltage responsiveness of the sample 2, symbol S3 indicates voltage responsiveness of the sample 3, and symbol S4 indicates voltage responsiveness of the sample 4.

As a result of the test example 1, as can be understood also from FIG. 16A and FIG. 16B, it is found that the samples 1 to 3 (examples) have the more excellent soft recovery characteristic than the sample 4 (comparison example). It is also found that the sample 1 which is obtained by performing the heavy metal diffusion step at a temperature of 880° C. has the more excellent soft recovery characteristic that reverse recovery time trr becomes shorter and noises can be suppressed than the sample 3 which is obtained by performing the heavy metal diffusion step at a temperature of 820° C.

Test Example 2

Figure 17:
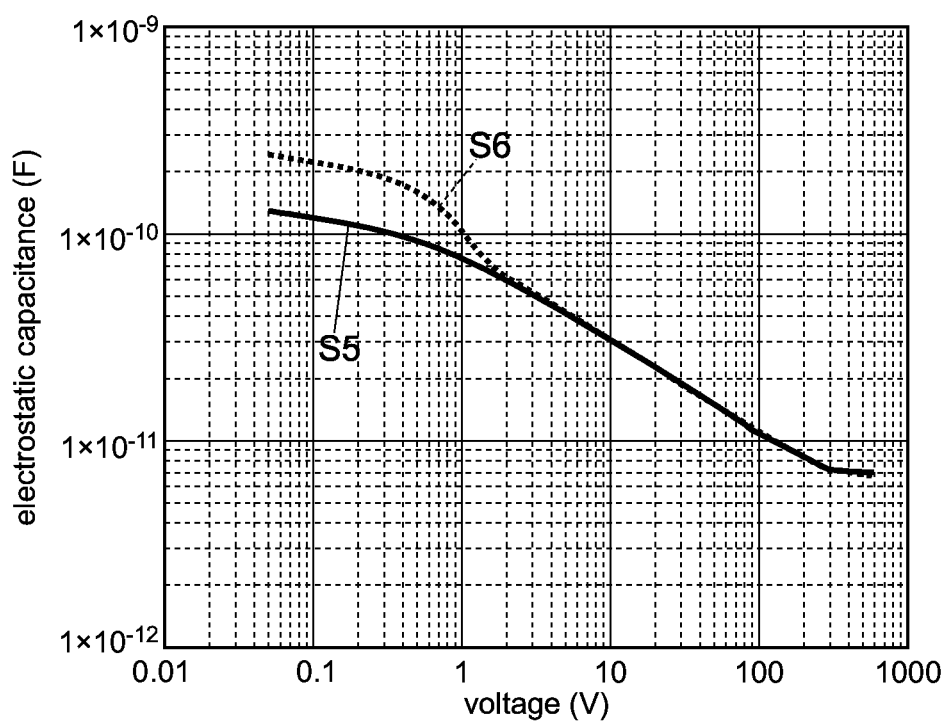
FIG. 17 is a graph showing the electrostatic capacitance of a test example 2.

Test example 2 is a test example to prove that the semiconductor device of the present invention is a semiconductor device which can be pinched off at a low voltage.
1. Preparation of Samples Basically, a semiconductor device having the substantially same structure as the semiconductor device according to the embodiment 4 is used as a sample 5 (example). A semiconductor device which has the substantially same structure as the sample 5 and into which heavy metal (platinum) is not introduced is used as a sample 6 (comparison example).
2. Test Method Electrostatic capacitances of the respective samples (samples 5, 6) when a reverse voltage VR (0.05V to 600V) is applied to an anode electrode with respect to a cathode electrode are measured. The measurement is performed using a CV measuring device.
3. Test Result FIG. 17 is a graph showing electrostatic capacitances of the samples 5, 6 in the test example 2. In FIG. 17, symbol S5 indicates the electrostatic capacitance of the sample 5, and symbol S6 indicates the electrostatic capacitance of the sample.

As a result of the test example 2, as can be also understood from FIG. 17, while an electrostatic capacitance is lowered at a voltage of 0.3V to 2V in the case of the sample 6 (comparison example), an electrostatic capacitance is lowered at a voltage lower than 0.05V in the case of the sample 5 (example). This means that the electrostatic capacitance of the sample 5 (example) is lowered at a voltage lower than a voltage at which the electrostatic capacitance of the sample 6 (comparison example) is lowered. That is, the sample 5 (example) is pinched off at a voltage lower than a voltage at which the sample 6 (comparison example) is pinched off.

Although the semiconductor device of the present invention has been explained heretofore in conjunction with the above-mentioned embodiments, the present invention is not limited to the above-mentioned embodiments, and can be carried out without departing from the gist of the present invention. For example, the following modifications are also conceivable.

(1) In the above-mentioned respective embodiments, platinum is used as heavy metal. However, the present invention is not limited to platinum. For example, the present invention may use a metal material other than platinum (for example, gold).

(2) In the above-mentioned respective embodiments, the heavy metal diffusion source layer is formed by using a coating liquid for forming a heavy metal diffusion source layer which is made of a coating liquid for forming a silicon oxide film coating. However, the present invention is not limited to such a heavy metal diffusion source layer. For example, the heavy metal diffusion source layer may be formed using a coating liquid for forming a heavy metal diffusion source layer which differs from the coating liquid for forming a silicon oxide film coating. A heavy metal diffusion source layer which is formed of a heavy metal film may be formed by a vapor deposition method or a sputtering method.

(3) In the above-mentioned respective embodiments, aluminum is used as a material of barrier metal. However, the present invention is not limited to aluminum. For example, metal materials other than aluminum (for example, molybdenum, titanium, platinum or the like) may be used.

(4) In the above-mentioned respective embodiments, the semiconductor base body 110 which has the structure where the n$^+$-type semiconductor layer 112 and the n$^-$-type semiconductor layer 114 are directly laminated to each other is used. However, the present invention is not limited to such a structure. For example, a semiconductor base body 110 where another semiconductor layer (for example, an n$^{--}$-type semiconductor layer, an n-type semiconductor layer or the like) is interposed between the n$^+$-type semiconductor layer 112 and the n$^-$-type semiconductor layer 114 may be also used.

The invention claimed is:

1. A semiconductor device comprising:
   a semiconductor base body having the structure where a first semiconductor layer of a first conductive type and a second semiconductor layer of a first conductive type containing an impurity of a first conductive type at a concentration lower than a concentration of the impurity of the first conductive type contained in the first semiconductor layer are laminated to each other in this order;
   a high concentration diffusion region of a second conductive type selectively formed on a surface of the second semiconductor layer, and containing an impurity of a second conductive type opposite to the conductive type of the impurity of the first conductive type at a concentration higher than a concentration of the impurity of the first conductive type which the second semiconductor layer contains; and
   a barrier metal layer formed on a surface of the second semiconductor layer and a surface of the high concentration diffusion region, forming a Schottky junction between the barrier metal layer and the second semiconductor layer, and forming an ohmic junction between the barrier metal layer and the high concentration diffusion region, wherein
   heavy metal is diffused into the semiconductor base body such that a concentration of heavy metal becomes maximum in a surface of the second semiconductor layer, by forming a mask on the surface of the second semiconductor layer, by forming a mask on the surface of the second semiconductor layer, by forming a heavy metal diffusion source layer on the surface of the first semiconductor layer and by applying thermal treatment to the semiconductor base body, wherein
   assuming
   a depth position in the surface of the second semiconductor layer as D1,
   a depth position in a deepest portion of the high concentration diffusion region as D2,
   a depth position which is deeper than the depth position D2 and is shallower than a boundary surface between the first semiconductor layer and the second semiconductor layer as D3,
   a depth position of the boundary surface between the first semiconductor layer and the second semiconductor layer as D4, and
   a depth position in the surface of the first semiconductor layer as D5,
   the concentration of the heavy metal at the depth position D4 is higher than the concentration of the heavy metal at the depth position D3, and wherein
   the concentration of the heavy metal at the depth position D2 is higher than the concentration of the heavy metal at the depth position D3.

2. The semiconductor device according to claim 1, wherein the depth position D3 is a depth position at which a tail current is controllable at the time of switching off the semiconductor device.

3. The semiconductor device according to claim 1, wherein the concentration of the heavy metal at the depth position D1 is higher than the concentration of the heavy metal at the depth position D5.

4. The semiconductor device according to claim 1, wherein the concentration of the heavy metal in the surface of the second semiconductor layer is higher than the concentration of the heavy metal in a surface of the high concentration diffusion region.

5. The semiconductor device according to claim 1, wherein the concentration of the heavy metal in the surface of the high concentration diffusion region is higher than the concentration of the heavy metal in the surface of the second semiconductor layer.

6. The semiconductor device according to claim 1, wherein the heavy metal is platinum.

* * * * *